(12) United States Patent
Hidaka

(10) Patent No.: US 6,870,757 B2
(45) Date of Patent: Mar. 22, 2005

(54) THIN FILM MAGNETIC MEMORY DEVICE APPLYING A MAGNETIC FIELD TO WRITE DATA

(75) Inventor: Hideto Hidaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/227,452

(22) Filed: Aug. 26, 2002

(65) Prior Publication Data

US 2003/0174536 A1 Sep. 18, 2003

(30) Foreign Application Priority Data

Mar. 4, 2002 (JP) ........................................ 2002-057459

(51) Int. Cl.⁷ .............................................. G11C 11/00
(52) U.S. Cl. ........................ 365/158; 365/171; 365/173
(58) Field of Search ................................ 365/158, 171, 365/173

(56) References Cited

U.S. PATENT DOCUMENTS

| 5,838,609 A | * | 11/1998 | Kuriyama | .................... 365/159 |
| 6,349,054 B1 | * | 2/2002 | Hidaka | ........................ 365/173 |
| 6,404,673 B1 | * | 6/2002 | Matsui | ........................ 365/173 |
| 6,490,217 B1 | * | 12/2002 | DeBrosse et al. | ......... 365/225.5 |
| 6,504,752 B2 | * | 1/2003 | Ito | ............................. 365/158 |
| 6,577,527 B2 | | 6/2003 | Freitag et al. | |

FOREIGN PATENT DOCUMENTS

KR 10-2001-0067421 10/2001

OTHER PUBLICATIONS

Scheuerlein et al., "A 10ns Read and Write Non–Volatile Memory Array Using a Magnetic Tunnel Junction and FET Switch in Each Cell", ISSCC Digest of Technical Papers, TA7.2, Feb. 2000, pp. 94–95, 128–129, 409–410.

Durlam et al., "Nonvolatile RAM based on Magnetic Tunnel Junction Elements", ISSCC Digest of Technical Papers, TA7.3, Feb. 2000, 96–97, 130–131, 410–411.

Naji et al., "A256kb 3.0V 1T1MTJ Nonvolatile Magnetoresistive RAM", ISSCC Digest of Technical Papers, TA7.6, Feb. 2001, pp. 94–95, 122–123, 404–405, 438.

Related U.S. patent application Ser. No. 09/982,936, filed Oct. 22, 2001 (Our Ref. 57454–224).

Related U.S. patent application Ser. No. 10/166,784, filed Jun. 12, 2002 (Our Ref. 57454–596).

* cited by examiner

Primary Examiner—Son Mai
(74) Attorney, Agent, or Firm—McDermott Will & Emery LLP

(57) ABSTRACT

Each write word line has one end connected by a write drive circuit to a power supply voltage selectively and the other end to a ground voltage. The write drive circuit is staggered in arrangement and thus connected to either one or the other end of each write word line. A write drive circuit has a first transistor and a second transistor. When a memory cell row corresponding to the write drive circuit is selected the first transistor connects a corresponding write word line to the power supply voltage to supply a data writing current and when an adjacent row is selected the transistor connects the corresponding write word line to the power supply voltage. The second transistor passes a magnetic field canceling current, which cancels a magnetic field leaking from a data writing current of an adjacent row.

23 Claims, 15 Drawing Sheets

THIN FILM MAGNETIC MEMORY DEVICE APPLYING A MAGNETIC FIELD TO WRITE DATA

BACKGROUND OF THE INVENTION

1. Field of the Invention

The present invention relates generally to thin film magnetic memory devices and particularly to those having magnetic memory cells with magnetic tunnel junction (MTJ).

2. Description of the Background Art

A magnetic random access memory (MRAM) device has been noted as a memory device capable of non-volatile data storage with low power consumption. The MRAM device is a memory device capable of non-volatile data storage using a plurality of thin film magnetic elements formed in a semiconductor integrated circuit and allows random access to each of the thin film magnetic elements.

In recent years, in particular, it has been announced that a thin film magnetic element utilizing magnetic tunnel junction is used as a memory cell to significantly enhance the MRAM device in performance. An MRAM device having memory cells with magnetic tunnel junction is disclosed in technical documents such as "A 10 ns Read and Write Non-Volatile Memory Array Using a Magnetic Tunnel Junction and FET Switch in each Cell", ISSCC Digest of Technical Papers, TA7. Feb. 2, 2000., "Nonvolatile RAM based on Magnetic Tunnel Junction Elements", ISSCC Digest of Technical Papers, TA7. Feb. 3, 2000., and "A 256 kb 3.0V 1T1MTJ Nonvolatile Magnetoresistive RAM", ISSCC Digest of Technical Papers, TA7. Feb. 6, 2001.

FIG. 15 is a schematic diagram showing a configuration of a memory cell having a magnetic tunnel junction portion (hereinafter simply referred to as an "MTJ memory cell").

As shown in FIG. 15, the MTJ memory cell includes a tunneling magneto-resistance element TMR having an electric resistance varying with the level of data stored, and an access element ATR operative in a data read to form a path of a data read current Is passing through element TMR. Access element ATR is formed representatively by a field effect transistor and will thus hereinafter also be referred to as an access transistor ATR. Access transistor ATR is coupled between element TMR and a fixed voltage, e.g., a ground voltage Vss.

The MTJ memory cell is associated with a write word line WWL for indicating a data write, a read word line RWL for effecting a data read, and a bit line BL serving as a data line for transmitting an electrical signal corresponding to a level of data stored in reading and writing data.

FIG. 16 shows a concept for illustrating an operation effected to read data from the MTJ memory cell.

As shown in FIG. 16, tunneling magneto-resistance element TMR has a ferromagnetic layer FL magnetized in a fixed, determined direction (hereinafter also referred to as a "fixed magnetic layer"), and a ferromagnetic layer VL magnetized in a direction corresponding to an externally applied magnetic field (hereinafter also simply referred to as a "free magnetic layer"). Fixed and free magnetic layers FL and VL sandwich a tunneling barrier or film TB formed of insulative film. Depending on the level of data written to be stored, layer VL is magnetized in the same direction as layer FL or opposite in direction to layer FL. Layer FL, barrier TB and layer VL together form a magnetic tunnel junction.

In a data read, read word line RWL is activated and access transistor ATR responsively turns on. This allows bit line BL, element TMR, transistor ATR and the fixed voltage (ground voltage Vss) to form a current path passing data read current Is.

Element TMR provides an electric resistance varying with a relative relationship between a direction in which layer FL is magnetized and that in which layer VL is magnetized. More specifically, if layers FL and VL are magnetized in a single direction (or in parallel), the electric resistance of element TMR is smaller than when the layers are magnetized in opposite directions (or in antiparallel).

As such, if layer VL is magnetized in a direction corresponding to data stored, then a variation in voltage that is introduced by current Is in element TMR depends on the level of the data stored. As such, if for example bit line BL is precharged to have a determined voltage and element TMR then has current Is passing therethrough, then by detecting the voltage on bit line BL the data stored in the MTJ memory cell can be read.

FIG. 17 shows a concept for illustrating an operation effected to write data to the MTJ memory cell.

With reference to FIG. 17, in writing data, read word line RWL is inactivated and access transistor ATR is turned off. In that state, a data write current is passed through write word line WWL and bit line BL to magnetize free magnetic layer VL in a direction corresponding to data to be written. Layer VL is magnetized in a direction determined by a data write current flowing through each of write word line WWL and bit line BL.

FIG. 18 shows a concept for illustrating how a tunneling magneto-resistance element is magnetized in writing data to the MTJ memory cell.

With reference to FIG. 18, a lateral axis H (EA) represents a magnetic field applied in tunneling magneto-resistance element TMR at free magnetic layer VL along an easy axis (EA). A vertical axis H (HA) represents a magnetic field acting at layer VL in a direction of a hard axis (HA). Magnetic fields H (EA) and H (HA) each correspond to one of two magnetic fields, respectively, created by electric currents flowing through bit line BL and write word line WWL, respectively.

In the MTJ memory cell, fixed magnetic layer FL has a fixed direction of magnetization along the easy axis and free magnetic layer VL is magnetized in accordance with levels (of "1" and "0") of stored data in the direction of the easy axis parallel to (or in the same direction as) layer FL or antiparallel to (or opposite in direction to) layer FL. Hereinafter in the present specification R1 and R0 represent levels of electric resistance of element TMR corresponding to the two types of direction in which layer VL is magnetized, wherein R1 is larger than R0. The MTJ memory cell can store 1-bit data ("1" and "0") corresponding to the two types of direction in which layer VL is magnetized.

The direction in which layer VL is magnetized can be rewritten only when the sum of applied magnetic fields H (EA) and H (HA) reaches a region outer than an asteroid characteristics line indicated in the figure. In other words, if an applied data writing magnetic field has an intensity corresponding to a region inner than the asteroid characteristics line the direction in which layer VL is magnetized does not switch.

As indicated in the asteroid characteristics line, applying to layer VL a magnetic field having the direction of the harder axis can reduce a threshold value for magnetization that is required to switch a direction of magnetization directed along the easy axis.

As shown in the FIG. 18 example, if a point of operation in writing data is designed, then in a MTJ memory cell to which the data is written a data writing magnetic field in the direction of the easy axis is designed to have an intensity $H_{WR}$. More specifically, data writing magnetic field $H_{WR}$ is obtained by appropriately designing in value a data writing current flowing through bit line BL or write word line WWL. Generally, magnetic field $H_{WR}$ is represented by the sum of a switching magnetic field $H_{SW}$ required to switch a direction of magnetization and a margin $\Delta H$, i.e., $H_{WR}=H_{SW}+\Delta H$.

Furthermore, rewriting data stored in the MTJ memory cell or a direction in which element TMR is magnetized entails passing a data writing current of no less than a predetermined level on both write word line WWL and bit line BL. Thus element TMR has layer VL magnetized parallel or antiparallel to layer FL to accommodate a direction of a data writing magnetic field directed along easy axis EA. The direction of magnetization once written in element TMR, or data stored in the MTJ memory cell, is held in a non-volatile manner until new data is written.

Tunneling magneto-resistance element TMR thus has an electric resistance varying with a direction of magnetization that is rewritable by an applied data writing magnetic field. As such, correlating two directions of magnetization of layer VL of element TMR with levels ("1" and "0") of data stored allows non-volatile data storage.

As has been described above, a MTJ memory cell to which data is written (hereinafter also referred to as a "selected memory cell") needs to have an electric field applied from both write word line WWL and bit line BL corresponding thereto, while from write word line WWL and bit line BL a magnetic field leaks and acts on an MTJ memory cell other than the MTJ memory cell to which the data is written (hereinafter also referred to as a "non-selected memory cell") and the magnetic filed thus introduces magnetic noise for the non-selected memory cell. If such a noise is large, the non-selected memory cell may disadvantageously have data written erroneously.

In particular, a non-selected memory cell in the same row or column as a selected memory cell has a magnetic field of a predetermined intensity applied thereto in either one of the direction of the easy axis or that of the hard axis. Accordingly it is necessary to prevent a magnetic field acting on each non-selected memory cell of a row or column adjacent to a selected row or column from being affected by a magnetic field leaking from write word line WWL of the selected row and bit line BL of the selected column, so that the former magnetic field does not reach a region outer than the asteroid characteristics line shown in FIG. 18.

SUMMARY OF THE INVENTION

The present invention contemplates a thin film magnetic memory device magnetically writing data thereto, preventing a non-selected memory cell from having data written thereto erroneously through magnetic noise.

The present invention generally provides a thin film magnetic memory device including: a memory array having a matrix of a plurality of magnetic memory cells each having a magnetic element magnetized in a direction corresponding to data stored; a plurality of write select lines provided for memory cell rows, respectively; a plurality of data lines provided for memory cell columns, respectively; a write control circuit driven by a result of a column selection to selectively pass a current on a data line corresponding to a selected magnetic memory cell, the current having a direction corresponding to write data; and a row select circuit driven by a result of a row selection for controlling selectively supplying a current to the plurality of write select lines, the row select circuit supplying a data writing current to the write select line corresponding to a selected row and a magnetic field canceling current to the write select line corresponding to a row adjacent to the selected row, the magnetic field canceling current being smaller than the data writing current, the magnetic field canceling current being directed in a direction opposite to that of the data writing current flowing on the write select line corresponding to the selected row, in each write select line the data writing current when the corresponding memory cell row is selected and the magnetic field canceling current when the adjacent row is selected being supplied in a single direction.

Thus a main advantage of the present invention is that while each write select line can continue to pass an electric current in a determined direction a write select line of a row adjacent to a selected row can have a current flowing therethrough to cancel a magnetic field leaking from a data writing current flowing through a write select line of the selected row. This eliminates the necessity of adopting a complicated circuit configuration to prevent an adjacent row's non-selected memory cell from having data written thereto erroneously.

Preferably the row select circuit includes a driver circuit provided for each write select line to supply the data writing current and the magnetic field canceling current, the driver circuit being driven by the result of the row selection to control a voltage of one of opposite ends and an intermediate point of a corresponding one of the plurality of write select lines.

Furthermore for the selected row the write select line can have an intermediate point serving as a boundary allowing a data writing current to be supplied only at a portion corresponding to a selected memory cell. This can prevent the selected row from having a non-selected memory cell with data written thereto erroneously.

The present invention in another aspect provides a thin film magnetic memory device including: a memory array having a matrix of a plurality of magnetic memory cells each having a magnetic element magnetized in a direction corresponding to data stored; a plurality of write select lines provided for memory cell rows, respectively; a plurality of data lines provided for memory cell columns, respectively; a row select circuit driven by a row select result for controlling selectively supplying a current to the plurality of write select lines; a write control circuit driven by a column select result and write data to be written to a selected magnetic memory cell, for controlling selectively supplying a current to the plurality of data lines, the write control circuit supplying the data line corresponding to a selected column with a data writing current having a direction corresponding to the write data, the write control circuit also supplying the data line corresponding to a column adjacent to the selected column with a magnetic field canceling current in a direction opposite to that of the data writing current flowing through the data line corresponding to the selected column, the magnetic field canceling current being smaller than the data writing current.

Accordingly, a selected column can be associated with a data line having a data writing current flowing therethrough in a direction corresponding to data to be written and an adjacent row can be associated with a data line having a current flowing therethrough to cancel a magnetic field leaking from a data writing current flowing through the data line of the selected column. This can eliminate the necessity of employing a complicated circuit configuration to prevent an adjacent column from having data written thereto erroneously.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
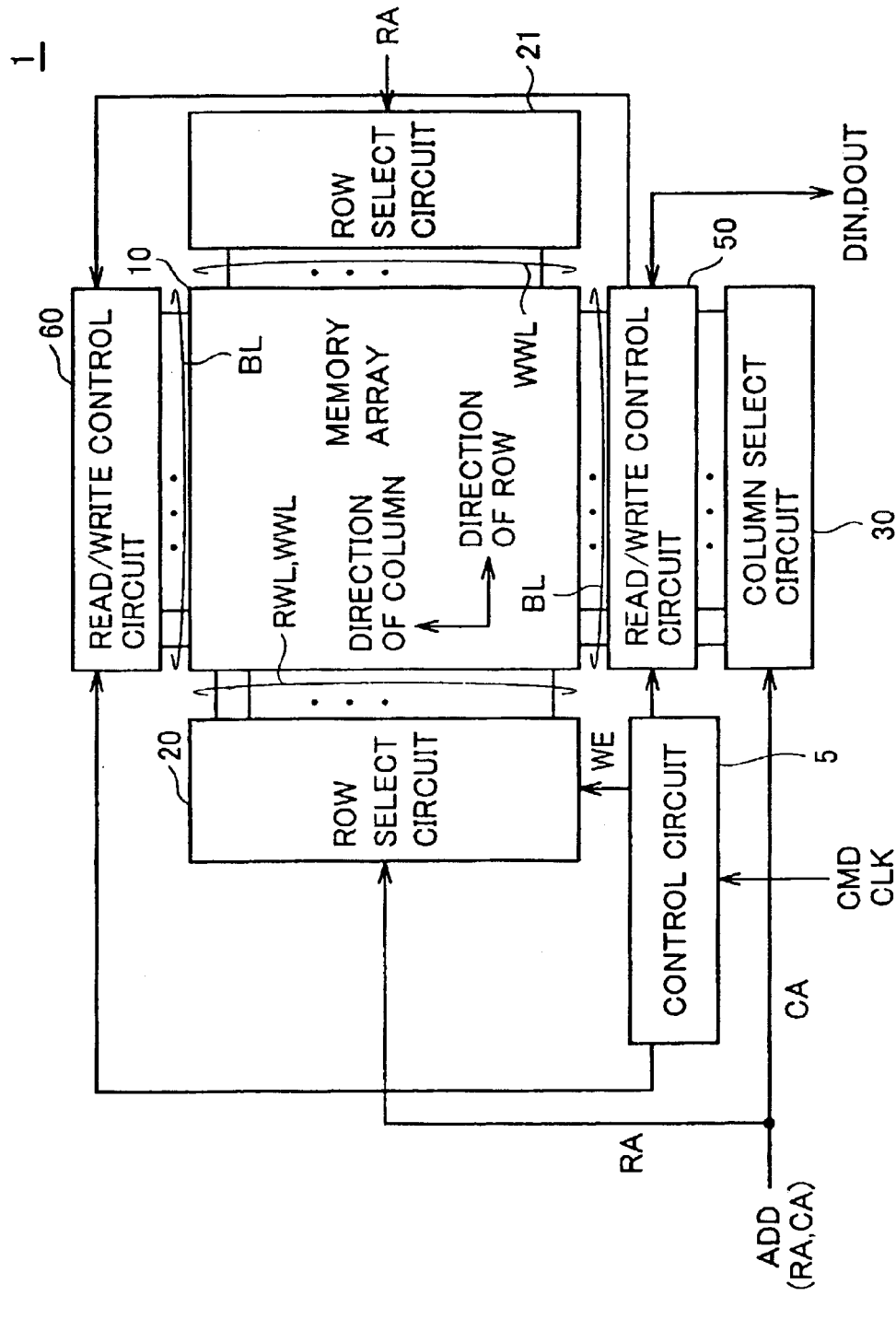
FIG. 1 is a block diagram schematically, generally showing a configuration of an MRAM device of the present invention in an embodiment.

Hereinafter the present invention in embodiments will be described with reference to the drawings more specifically. In the figures, like reference characters denote like components.

First Embodiment

With reference to FIG. 1, the present invention in an embodiment provides an MRAM device 1 operating in response to an externally applied control signal CMD and an address signal ADD to effect random access and input and output write data DIN and read data DOUT, respectively. MRAM device 1 operates to read and write data, for example as timed in synchronization with an externally applied clock signal CLK. Alternatively it may not receive clock signal CLK externally and instead internally determine a timing of operation.

MRAM device 1 includes a control circuit 5 operative in response to control signal CMD to control the general operation of MRAM device 1, and a memory array 10 having rows and columns of a plurality of MTJ memory cells. The rows of MTJ memory cells (hereinafter also simply referred to as "memory cell rows") are associated with a plurality of write word lines WWLs, respectively, and a plurality of read word lines RWLs, respectively. Furthermore, for the columns of MTJ memory cells (hereinafter also simply referred to as "memory cell columns") are associated with bit lines BLs, respectively.

MRAM device 1 also includes row select circuits 20 and 21, a column select circuit 30, and read/write control circuits 50 and 60.

Row select circuits 20, 21 select a row of memory array 10 in response to a row address RA indicated by address signal ADD. Column select circuit 30 selects a column of memory array 10 in response to a column address CA indicated by address signal ADD. Row select circuits 20 and 21 in reading data selectively activate read word line RWL and in writing data are driven by a result of a row selection to control selectively supplying a current to write word line WWL. Row and column addresses RA and CA indicate a memory cell selected in writing and reading data.

Read/Write control circuits 50, 60 generally refer to a group of circuits arranged in a region adjacent to memory array 10 to operate in reading and writing data to pass a data writing current and a data reading current through bit line BL of a memory cell column corresponding to a selected memory cell (hereinafter also referred to as a "selected column").

Figure 2:
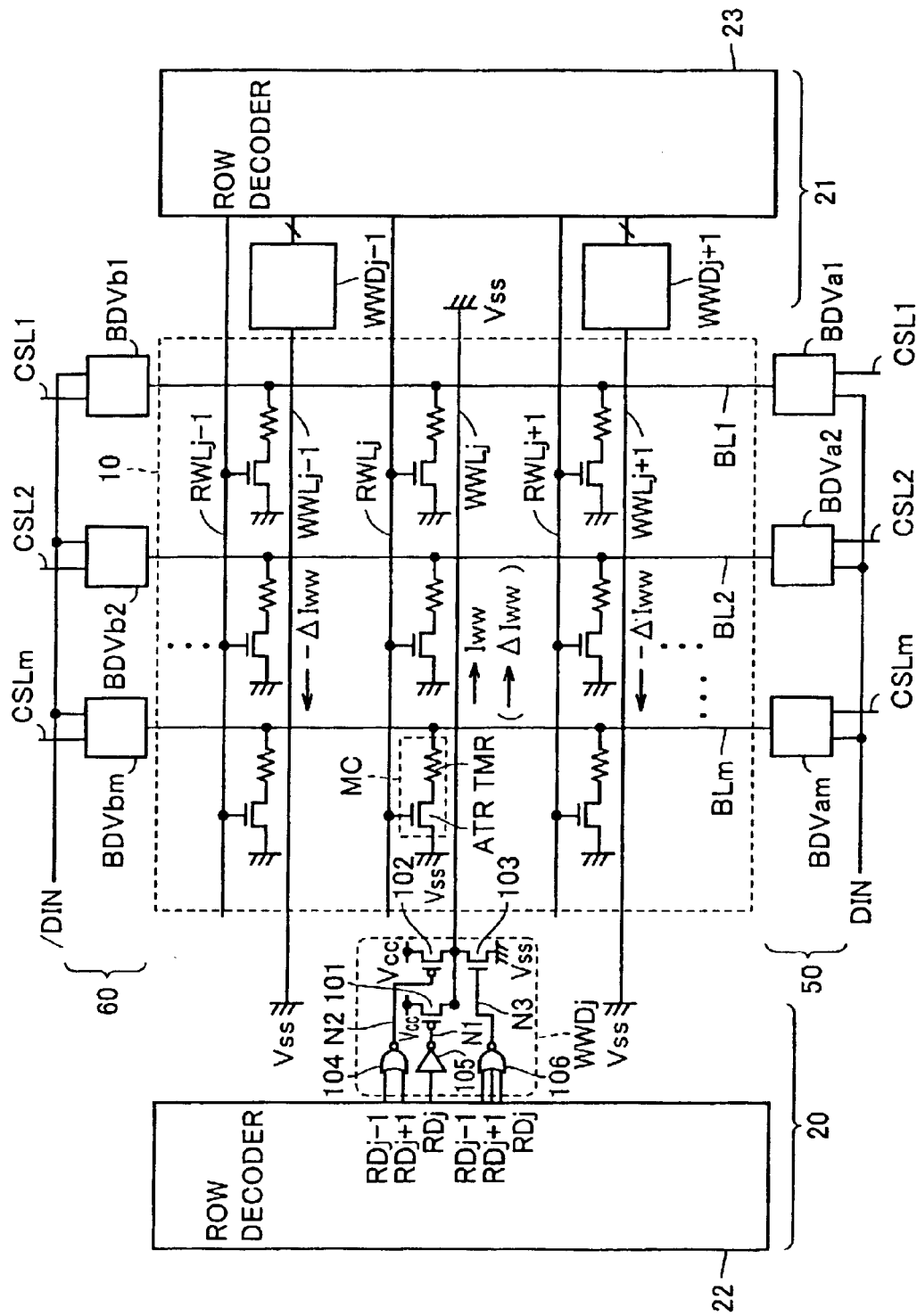
FIG. 2 is a circuit diagram for illustrating supplying a data writing current in accordance with a first embodiment.

FIG. 2 is a circuit diagram illustrating how the data writing current is supplied in accordance with the first embodiment. FIG. 2 representatively shows a configuration of a circuit for effecting an operation to write data to memory array 10.

As shown in FIG. 2, memory array 10 has MTJ memory cells MCs arranged in rows and columns. Each MTJ memory cell MC includes a tunneling magneto-resistance element TMR formed of a magnetic element magnetized in a direction corresponding to data stored, and an access transistor ATR. Element TMR and access transistor ATR are connected in series between a corresponding bit line BL and ground voltage Vss. Access transistor ATR is provided representatively by an MOS transistor corresponding to a field effect transistor formed on a semiconductor substrate.

FIG. 2 representatively shows MTJ memory cells of (j−1)th to (j+1)th rows and first, second and mth columns, and bit lines BL1, BL2, BLm, read word lines RWLj−1, RWLj, RWLj+1 and write word lines WWLj−1, WWLj, WWLj+1 corresponding to those MTJ memory cells, wherein j and m each represent a natural number.

Note that hereinafter if write word lines, read word lines and bit lines are generally referred to they are represented by reference characters WWL, RWL and BL, respectively, and that if a specific write word line, a specific read word line and a specific bit line are referred to they are denoted by the above reference characters with an additional character following thereto, such as WWL1, RWL1 and BL1, respectively. Furthermore hereinafter a signal and a signal line having a state of high voltage (e.g., power supply voltage Vcc) have a "high level" and those having a state of "low voltage" (e.g., ground voltage Vss) have a "low level."

In writing data, write word line WWL of a selected row has a data writing current flowing therethrough to generate a magnetic field having a direction along the hard axis of tunneling magneto-resistance element TMR and bit line BL of a selected column has a data writing current flowing therethrough to generate a magnetic field having a direction along the easy axis of element TMR. In other words, the direction of the data writing current flowing on bit line BL of the selected column needs to be controlled in accordance with the level of write data DIN.

Read/write control circuit 50 has bit line drive circuits BDVa1–BDVam provided for bit lines BL1–BLm, respectively, at their respective one ends. Similarly, read/write control circuit 60 has bit line drive circuits BDVb1–BDVbm provided for bit lines BL1–BLm, respectively, at their respective other ends. Hereinafter, bit line drive circuits BDVa1–BDVam will also generally be referred to as bit line drive circuit BDVa and bit line drive circuits BDVb1–BDVbm will also generally be referred to as bit line drive circuit BDVb.

Furthermore the memory cell columns are associated with column select lines CSL1–CSLm, respectively. Column select lines CSL1–CSLm will also generally be referred to as column select line CSL. Column select lines CSL in a selected column is driven high and thus activated and in a non-selected column pulled low and thus inactivated.

Each bit line drive circuit BDVa controls a voltage of one end of a corresponding bit line BL in response to a corresponding column select line CSL and write data DIN. Each bit line drive circuit BDVb controls a voltage of the other end of a corresponding bit line BL in response to a corresponding column select line CSL and an inverted version/DIN of the write data. For a selected column, bit line drive circuits BDVa and BDVb set one and the other ends of a corresponding bit line BL to have high and low levels corresponding to levels of write data DIN. For example, when write data DIN has the high level ("1") circuit BDVa couples one end of the bit line of the selected column with power supply voltage Vcc and circuit BDVb connects the other end of the bit line of the selected column to ground voltage Vss to allow the bit line of the selected column to have a data writing current flowing therethrough in a direction from read/write control circuit 50 to read/write control circuit 60.

In contrast, when write data DIN has the low level ("0") circuits BDVa and BDVb couple one and the other ends of the bit line of the selected column with ground voltage Vss and power supply voltage Vcc, respectively, to allow the bit line of the selected column to have a data writing current flowing therethrough in a direction opposite to that followed when write data DIN has the high level ("1"). For a non-selected column, circuits BDVa and BDVb connect each of one and the other ends of a corresponding bit line BL to ground voltage Vss. As a result, the bit line of the non-selected column does not have a data writing current flowing therethrough.

In writing data, write word line WWL is supplied with a current, as described hereinafter. Hereinafter, a jth row is an even-numbered row.

Row select circuit 20 includes a row decoder 22, and a write drive circuit provided for write word line WWL of an even-numbered row. FIG. 2 representatively shows a write drive circuit WWDj corresponding to a write word line WWLj of the jth row. Row select circuit 21 includes a row decoder 23 and a write drive circuit provided for write word line WWL of an odd-numbered row. FIG. 2 representatively shows write drive circuits WWDj−1 and WWDj+1 corresponding to write word lines WWLj−1 and WWLj+1 of (j−1)th and (j+1)th rows, respectively. Hereinafter, if write drive circuits provided for write word lines WWLs, respectively, are generally referred to they will be represented simply as a write drive circuit WWD.

Each write drive circuit WWD is configured similarly and accordingly in FIG. 2 a circuit configuration of write drive circuit WWDj of the jth row will representatively be described.

Write drive circuit WWDj receives from row decoder 22 row decode signals RDj−1, RDj, RDj+1 indicating a result of row selection of a corresponding memory cell row and adjacent rows. Row decode signal RDj−1 is driven high and thus activated when a (j−1)th row is selected. Row decode signal RDj is driven high and thus activated when a jth row is selected. Row decode signal RDj+1 is driven high and thus activated when a (j+1)th row is selected.

Write drive circuit WWDj includes p channel MOS transistors 101 and 102 connected in parallel between power supply voltage Vcc and one end of write word line WWLj that is closer to circuit WWDj, and an n channel MOS transistor 103 connected between one end of write word line WWLj and ground voltage Vss. Transistors 101, 102 and 103 have their respective gates connected to nodes N1, N2 and N3, respectively.

Write drive circuit WWDj also includes an inverter 105 inverting row decode signal RDj and transmitting it to node N1, and a logic gate 104 outputting an NOR of row decode signals RDj−1 and RDj+1 to node N2, and a logic gate 106 outputting an NOR of row decode signals RDj−1, RDj and RDj+1 to node N3.

If the jth row is selected, node N1 is set low and nodes N2 and N3 are set high. As a result, write word line WWLj has one end connected by transistor 101 to power supply voltage Vcc.

Furthermore, if the adjacent (j−1)th or (j+1)th row is selected, node N1 is set high and nodes N2 and N3 are set low. As a result, write word line WWLj has one end connected by transistor 102 to power supply voltage Vcc.

Note that if none of the jth row and the adjacent (j−1)th and (j+1)th rows are selected, nodes N1–N3 are each set high. As a result, write word line WWLj has one end connected by transistor 103 to ground voltage Vss.

Write word line WWLj has the other end (the end opposite to write drive circuit WWDj) connected to ground voltage Vss independently of which row is selected. As such, when the corresponding jth row is selected, write drive circuit WWDj passes on the corresponding word line WWLj a data writing current Iww corresponding to the ability of transistor 101 to drive a current.

If the adjacent row or the (j−1)th or (j+1)th row is selected, write drive circuit WWDj supplies the corresponding write word line WWLj with a current ΔIww corresponding to the ability of transistor 102 to drive a current. More specifically, in each write word line WWL, data writing current Iww flowing when a corresponding memory cell row is selected and current ΔIww flowing when an adjacent row is selected have the same direction. That is, each write drive circuit WWD supplies a current in a limited direction and its circuit configuration would thus never be complicated.

Note that transistor 101 has a current driving ability designed to be larger than transistor 102. More specifically, data writing current Iww is larger than ΔIww. For example, a transistor can have a current driving ability adjusted by the design of its size (or gate width-to-gate length ratio).

If none of the corresponding jth row and the adjacent (j−1)th and (j+1)th rows are selected, write word line WWLj does not have a current flowing therethrough.

A similarly configured write drive circuit WWD is arranged such that it is staggered to correspond to one of opposite ends of every other write word line WWL and the other end of opposite ends of each write word line WWL other than every other write word line WWL. The end of write word line WWL that is free of write drive circuit WWD is connected to ground voltage Vss despite which row is selected. For example, write word lines corresponding to odd-numbered rows including write word lines WWLj−1 and WWLj+1 are directly connected to ground voltage Vss in a region located closer to row select circuit 20 and write word lines corresponding to even-numbered rows including write word line WWLj are directly connected to ground voltage Vss in a region located closer to row select circuit 21.

Thus a write word line of a selected row has data writing current Iww flowing therethrough in a direction and that of an adjacent row has current ΔIww flowing therethrough in an opposite direction (note that hereinafter current ΔIww will also be referred to as a current −ΔIww with its direction taking into consideration). For example if the jth row is selected, write word line WWLj of the selected row has data writing current Iww flowing therethrough in a direction from row select circuit 20 to row select circuit 21, while write word lines WWLj−1 and WWLj+1 of the adjacent rows each have current −ΔIww flowing therethrough in a direction from row select circuit 21 to row select circuit 20, i.e., in a direction opposite to that followed by data writing current Iww flowing on write word line WWLj.

Thus a magnetic field generated by data writing current Iww of the selected row and leaking and thus acting on an MTJ memory cell of an adjacent row can be cancelled by a magnetic field generated by current ΔIww of the adjacent row. This can prevent the adjacent row from having an MTJ memory cell having data erroneously written thereto and the MRAM device can thus operate more reliably. Thus hereinafter current ΔIww passed through an adjacent row will also be referred to as a "magnetic field canceling current."

Write drive circuits WWDs staggered for each row allow two types of voltage, power supply voltage Vcc and ground voltage Vss, to implement such provision of magnetic field canceling current ΔIww. In other words, if write drive circuits WWDs are arranged only on one side a negative voltage further needs to be supplied to each write drive circuit WWD. Furthermore, the staggered write drive circuits WWDs can also contribute to an alleviated layout in arrangement of write drive circuit WWD and hence a miniaturized MRAM device.

Figure 18:
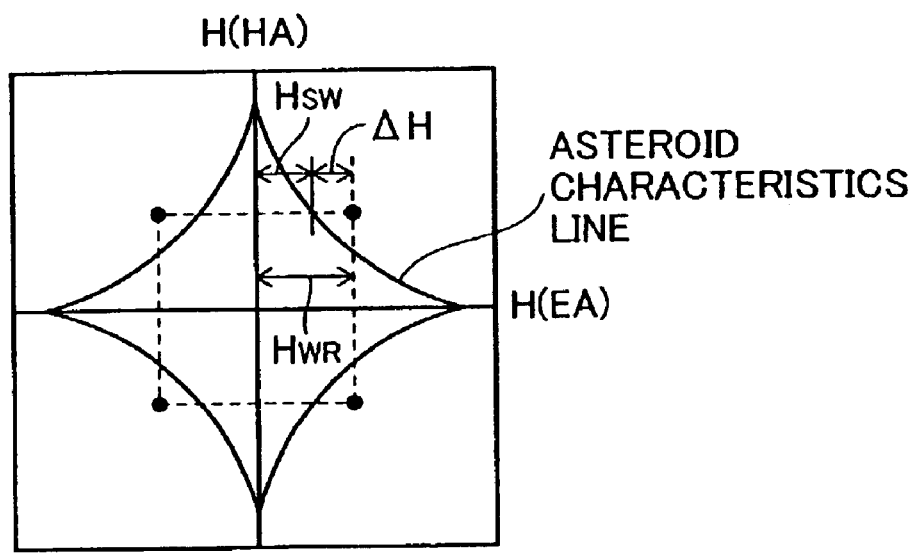
FIG. 18 represents a concept for illustrating how a tunneling magnetic resistance element is magnetized in writing data to an MTJ memory cell.

Note that, as has been described with reference to FIG. 18, a selected memory cell has tunneling magneto-resistance element TMR magnetized in a direction set in accordance with a magnetic field provided along an easy axis, i.e., a direction of a data writing current flowing on bit line BL. In other words, write word line WWL passes a data writing current in a direction which does not directly affect a direction in which element TMR is magnetized. Thus, although an odd-numbered row and an even-numbered row are associated with their respective write word lines WWLs having a data writing current flowing therethrough in directions, respectively, set to be opposite to each other, such does not prevent a data write operation.

Note that although FIG. 2 does not provide illustration in details, an operation effected to read data from memory array 10 will also be described briefly. In reading data, read word line RWL corresponding to a selected row is driven high and thus activated and in the selected row at each MTJ memory cell access transistor ATR turns on to couple each of bit lines BL1–BLm with ground voltage Vss via tunneling magneto-resistance element TMR. Note that drive circuits for read word lines RWLs that are not shown can also be staggered in arrangement for each row. Furthermore, by coupling a bit line of a selected column with a predetermined voltage to introduce a difference in voltage between opposite ends of element TMR, a current corresponding to data stored in a selected memory cell can be generated on the bit line of the selected column. By detecting a current passing through the bit line of the selected column, reading data from a selected memory cell can be effected.

First Embodiment in First Variation

Figure 3:
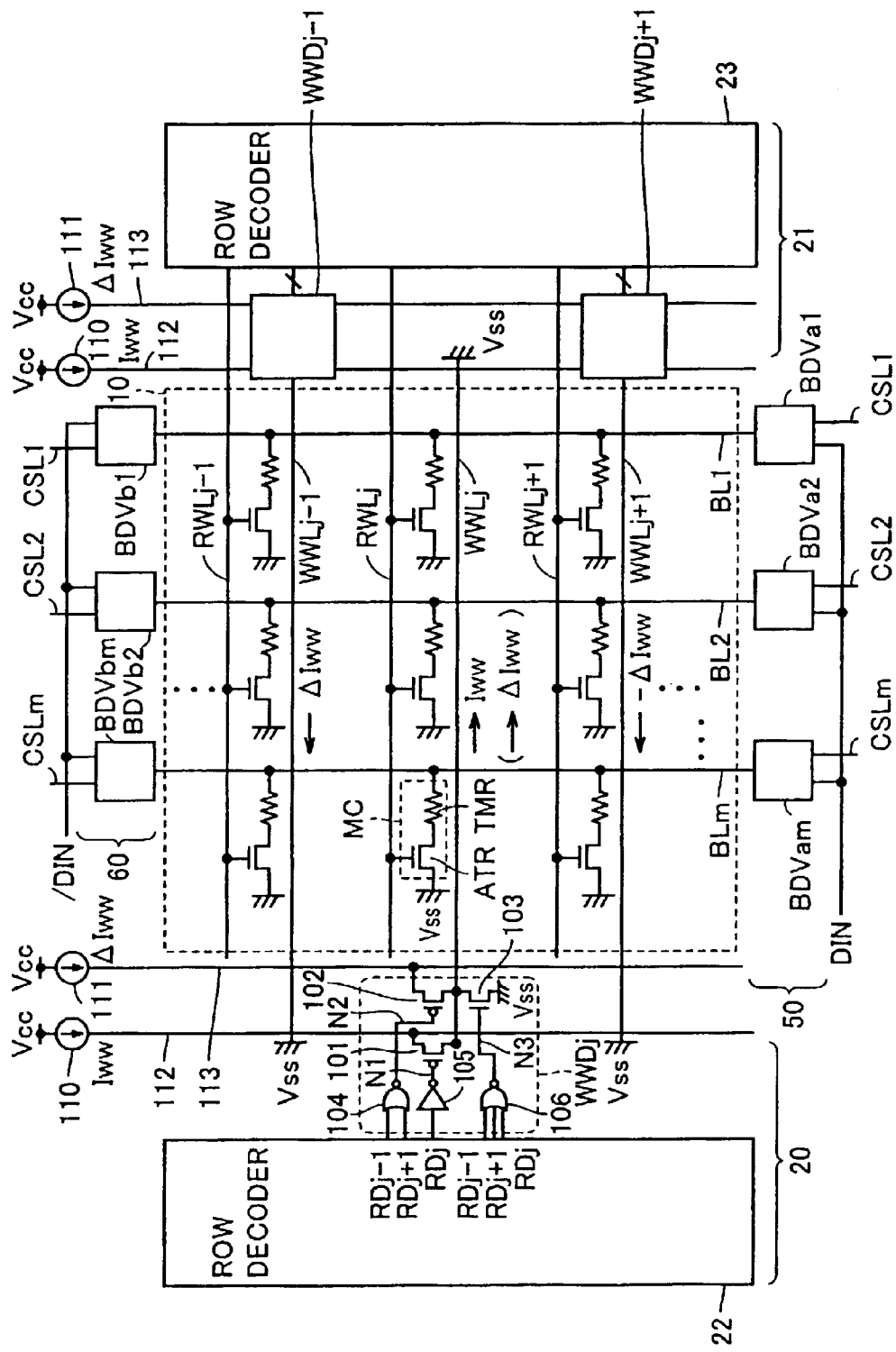
FIG. 3 is a circuit diagram for illustrating supplying a data writing current in accordance with a first variation of the first embodiment.

With reference to FIG. 3, the first embodiment in a first variation is different in configuration from the first embodiment of FIG. 2 in that row select circuits 20 and 21 are each associated with current supply circuits 110 and 111 and current supply lines 112 and 113. Current supply circuit 110 produces data writing current Iww supplied to write word line WWL of a selected row and current supply circuit 111 produces magnetic field canceling current ΔIww passed on write word line WWL of an adjacent row.

Currents Iww and ΔIww are supplied through lines 112 and 113, respectively. In other words, each write drive circuit WWD receives power supply voltage Vcc on lines 112 and 113.

Figure 4:
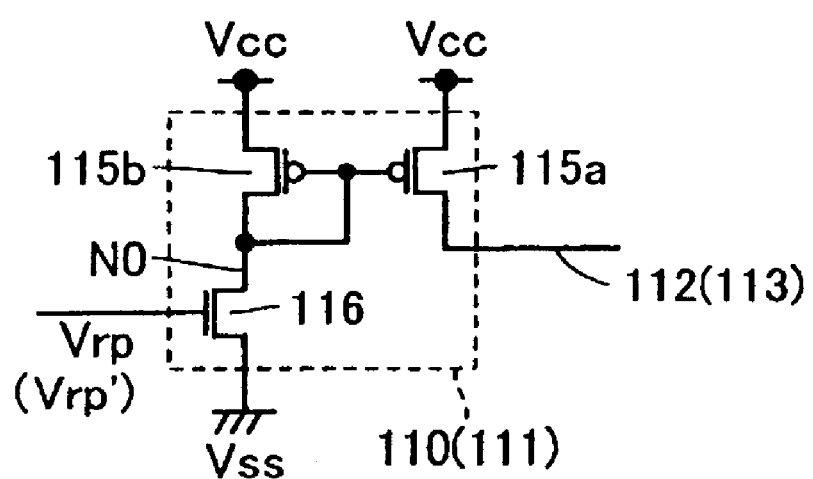
FIG. 4 is a circuit diagram showing a configuration of a current supply circuit shown in FIG. 3.

FIG. 4 is a circuit diagram showing a configuration of current supply circuits 110 and 111.

As shown in FIG. 4, current supply circuit 110 includes a p channel MOS transistor 115a connected between power supply voltage Vcc and current supply line 112, a p channel MOS transistor 115b connected between a node N0 and power supply voltage Vcc, and an n channel MOS transistor 116 connected between node N0 and ground voltage Vss. Transistors 115a and 115b have their respective gates coupled with node N0 and transistor 116 has its gate receiving a control voltage Vrp. Current supply circuit 110 thus has a current mirror formed by transistors 115a and 115b to supply power supply line 112 with a constant current corresponding to control voltage Vrp.

Current supply circuit 111 is similar in configuration to current supply circuit 110 and it supplies current supply line 113 with a constant current corresponding to a control voltage Vrp'. Control voltages Vrp and Vrp' are set to correspond to data writing current Iww and magnetic field canceling current ΔIww, respectively, shown in FIG. 2.

Reference will be made again to FIG. 3 to describe a configuration of write drive circuit WWD. FIG. 3 also representatively shows a configuration of write drive circuit WWDj. In the first embodiment in the first variation transistor 101 is electrically coupled between power supply line 112 and one end of write word line WWLj and transistor 102 is electrically coupled between current supply line 113 and one end of write word line WWLj and transistor 102 is electrically coupled between current supply line 113 and one end of write word line WWLj. This allows transistors 101 and 102 to be designed to have the same size or the same current driving ability. Other than that, write drive circuit WWDj is similar to that shown in FIG. 2. The other components shown in FIG. 3 are also similar in configuration and operation to those described in the first embodiment.

Thus as well as in the configuration of the first embodiment the write word line of a selected row can be supplied with a predetermined data writing current and those of adjacent rows can each be supplied with a current to cancel a leaking magnetic field introduced by the data writing current.

First Embodiment in Second Variation

The first embodiment in a second variation provides a configuration providing a hierarchical-decoding to control a current supplied to write word line WWL, as described hereinafter.

Figure 5:
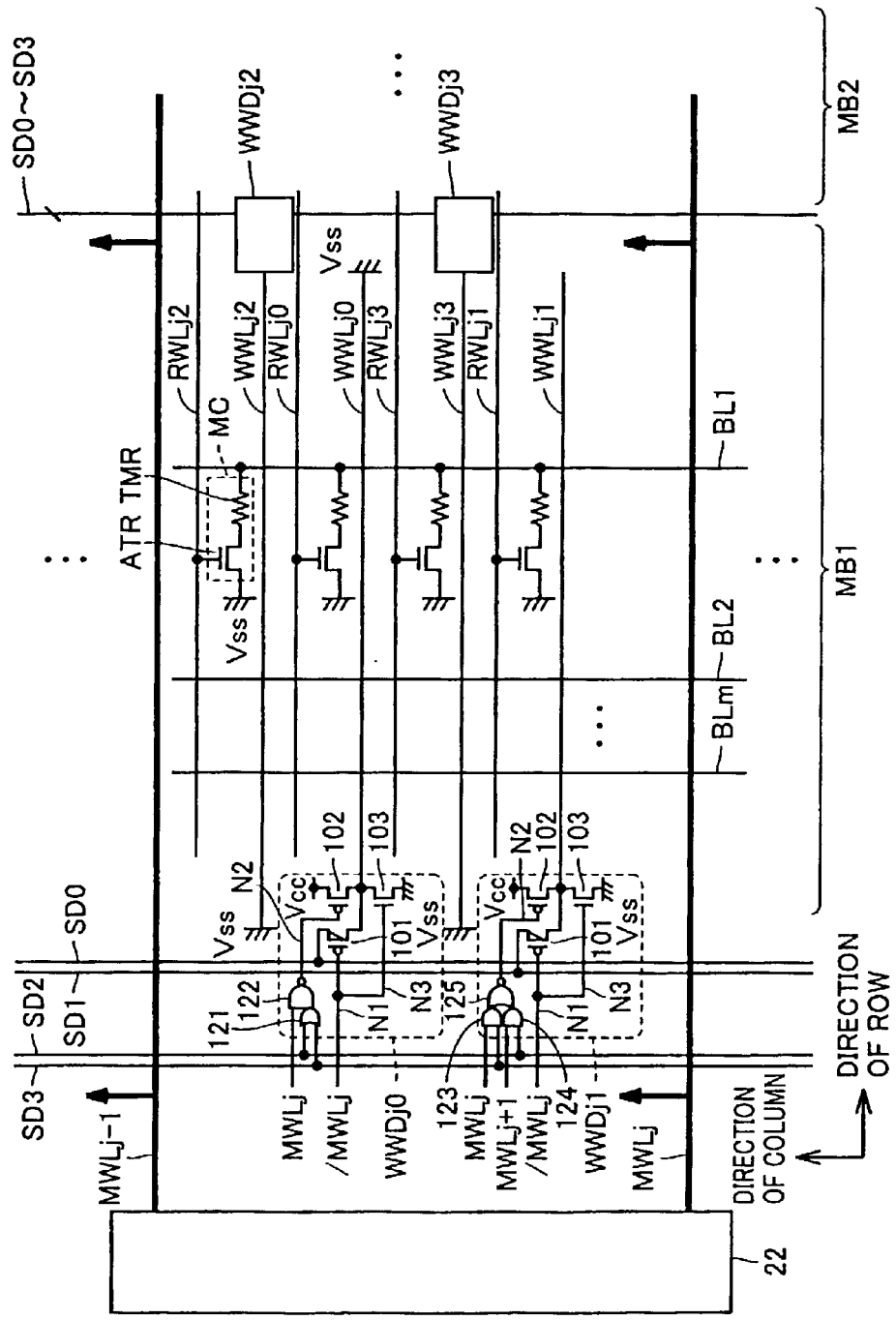
FIG. 5 is a circuit diagram illustrating supplying a data writing current to a write word line in accordance with a second variation of the first embodiment.

With reference to FIG. 5 showing the first embodiment in the second variation memory array 10 has a plurality of MTJ memory cells MCs divided in the direction of the columns into a plurality of memory blocks MBs. FIG. 5 representatively shows a top memory block MB1. Write word line WWL for each memory cell row is divided for each memory block MB. Furthermore, a main word line MWL is arranged to be shared by each memory block MB for every K memory cell rows, wherein K represents a natural number.

In FIG. 5, K=4. More specifically in each memory block MB a single main word line MWL is associated with four write word lines WWLs. FIG. 5 representatively shows a configuration corresponding to a jth main word line MWLj for the top memory block MB1, wherein j represents a natural number. More specifically, for memory block MB1 main word line MWLj is associated with four write word lines WWlj0, WWLj1, WWLj2, WWLj3. Read word line RWL is also similarly arranged. More specifically, for memory block MB1 main word line MWLj is associated with four read word lines RWLj0–RWLj3.

Furthermore, for each memory block MB at opposite ends thereof subdecode signals SD0–SD3 are transmitted. Subdecode signals SD0–SD3 are set for each memory block MB independently and are activated selectively to select one of the four write word lines WWLs and one of the four read word lines RWLs in a memory block including a selected memory cell (hereinafter also referred to as a "selected block") that correspond to a single main word line MWL. For example, if write word line WWLj0 is selected subdecode signal SD0 is driven high and thus activated and the remaining subdecode signals SD1–SD3 are set low, while for a non-selected memory block MB subdeocde signals SD0–SD3 are each set low.

Write drive circuit WWD is provided for each write word line WWL, as described in the first embodiment. Thus for each memory block MB write drive circuit WWD is staggered in arranged to correspond to one of opposite ends of every other write word line WWL and the other of opposite ends of each write word line WWL other than every other write word line WWL. For example, as shown in FIG. 5, write drive circuits WWDj and WWDj1 corresponding to write word lines WWLj0 and WWLj1, respectively, and write drive circuits WWDj2 and WWDj3 corresponding to write word lines WWLj2 and WWLj3, respectively, are arranged on opposite sides, respectivley.

Each write drive circuit WWD operates as described in the first embodiment and when a corresponding write word line is selected the circuit supplies data writing current Iww to the write word line and when an adjacent row is selected the circuit supplies magnetic field canceling current ΔIww to the word line. FIG. 5 exemplarily shows a configuration of a write drive circuit provided to correspond to write word lines WWLj0 and WWLj1.

In write drive circuit WWDj0 provided for write word line WWLj0 transistor 101 for supplying data writing current Iww is provided between a signal line transmitting the corresponding subdecode signal SD0 and write word line WWLj0 and transistor 102 for supplying magnetic field canceling current ΔIww is provided between power supply voltage Vcc and write word line WWLj0. Transistor 103 is provided, as described in the configuration according to the first embodiment, between ground voltage Vss and write word line WWLj0.

Nodes N1 and N3 receive /MWLj, an inverted version of a corresponding main word line MWLj. Thus when a corresponding main word line MWLj is driven high and thus activated, transistors 101 and 103 turn on and off, respectively. Thus write word line WWLj is supplied with data writing current Iww when main word line MWLj is driven high and thus activated and furthermore subdecode signal SD0 is also driven high and thus activated.

Write drive circuit WWDj0 further includes a logic gate 121 outputting an OR of subdecode signals SD2 and SD3, and a logic gate 122 outputting an NAND of an output of logic gate 121 and a level in voltage of main word line MWLj to node N2. Thus transistor 102 turns on when either write word line WWLj2 or WWLj3 adjacent to the corresponding write word line WWLj0 is selected. As a result, magnetic field canceling current ΔIww flows on write word line WWLj0 in a direction opposite that of data writing current Iww flowing on write word line WWLj2 or WWLj3 and thus cancels a leaking magnetic field introduced by data writing current Iww of a selected row.

In contrast, if a corresponding main word line MWLj is set low and thus inactivated, write word line WWLj0 is fixed at ground voltage Vss. Write word line WWLj0 thus has opposite ends fixed at ground voltage Vss and a current thus does not flow.

Write drive circuit WWDj1 provided for write word line WWLj1 has a slightly different decoding configuration as one of adjacent rows is correlated to another main word line MWLj+1 (not shown).

For write drive circuit WWDj1 transistor 101 is provided between a signal line transmitting the corresponding subdecode signal SD1 and write word line WWLj1 and transistors 102 and 103 are provided as described for write drive circuit WWDj0, arranged between power supply voltage Vcc and ground voltage Vss and write word line WWLj1. Nodes N1 and N3, as well as those of write drive circuit WWDj0, receive a /MWLj corresponding to an inverted level of main word line MWLj.

Write drive circuit WWDj1 further includes a logic gate 123 outputting an AND of a level in voltage of main word line MWLj and that in voltage of subdecode signal SD3, a logic gate 124 outputting an AND of a level in voltage of main word line MWLj+1 and that in voltage of subdecode signal SD2, and a logic gate 125 outputting an NOR of an output of logic gate 123 and that of logic gate 124 to node N2.

As such, if either write word line WWLj3 or a top write word line (not shown) corresponding to main word line MWLj+1 is selected, transistor 102 turns on to supply write word line WWLj+1 with magnetic field canceling current ΔIww.

Write drive circuits WWDj2 and WWj3, as well as write drive circuits WWDj1 and WWDj0, receive subdecode signals SD0–SD3. For write drive circuit WWDj3, the corresponding write word line (WWLj3) and both of the write word lines (WWLj1 and WWLj0) of the adjacent rows correspond to a single main word line MWLj and accordingly it is configured similar to write drive circuit WWDj0 and a subdecode signal is switched, as appropriate. For write drive circuit WWDj2, in contrast, one of adjacent write word lines is correlated to a different main word line MWLj−1 and accordingly it needs to be configured similar to write drive circuit WWDj1 to switch a subdeocde signal, as appropriate.

Thus if hierarchical-decoding is based on to control a current supplied to write word line WWL an adjacent row can also be prevented from having a non-selected memory cell having data written thereto erroneously. Furthermore the hierarchical decoding configuration can also prevent a large scale memory array from having an increased chip area. In other words, despite an increased number of memory cell rows, the FIG. 2 row decoders 22 and 23 can be prevented from having an increased circuit area and the MRAM device can thus be prevented from having a significantly increased scale.

First Embodiment in Third Variation

The first embodiment in the first and second variations provides a configuration with a write drive circuit arranged at an end of write word line WWL. In addition thereto, the first embodiment in a third variation provides a configuration with a write drive circuit also arranged at an intermediate point of write word line WWL, as described hereinafter.

FIGS. 6–9 are circuit diagrams for illustrating an example of supplying a data writing current to a write word line in accordance with the third variation of the first embodiment.

Figure 6:
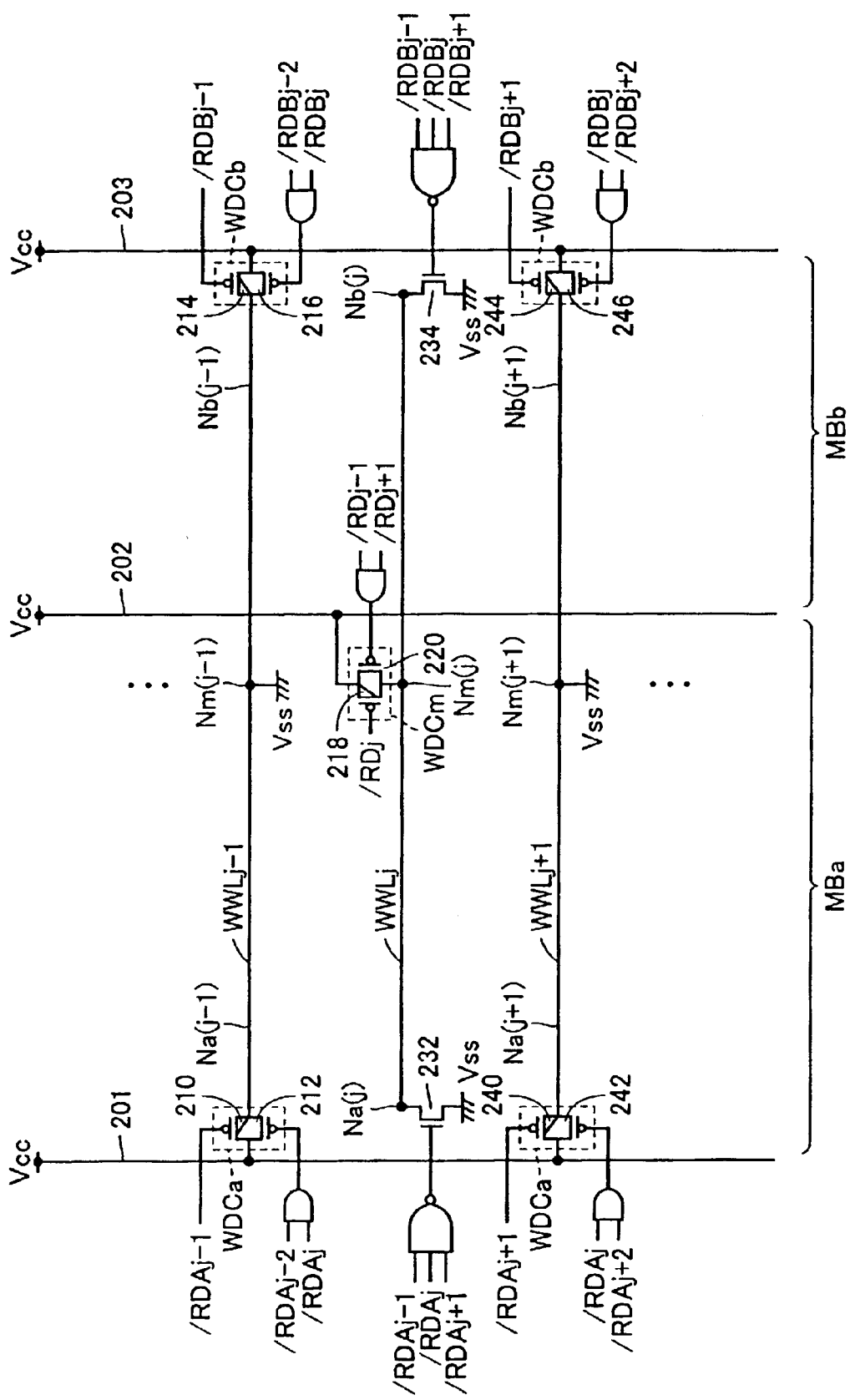
FIG. 6 is a circuit diagram illustrating a first example of supplying a data writing current to a write word line in accordance with a third variation of the first embodiment.

With reference to FIG. 6 showing a configuration in accordance with the third variation of the first embodiment, memory array 10 is divided by an intermediate node (an intermediate point) Nm into memory blocks MBa and MBb. Furthermore, each write word line WWL has one end, an intermediate point and the other end associated with power supply lines 201, 202 and 203, respectively, each transmitting power supply voltage Vcc. A write drive circuit WDC is provided for every other row at opposite ends of write word line WWL and for the other rows at an intermediate point of write word line WWL.

Although not shown in FIGS. 6–9, each memory cell column is associated with bit line BL and bit line drive circuits BDVa, BDVb, as well as in the FIG. 2 configuration.

An odd-numbered write word line WWL has opposite ends with write drive circuits WDCa and WDCb, respectively, and the intermediate node connected to ground voltage Vss.

Write drive circuit WDCa receives a row select signal /RDAi reflecting information of a selection of a memory block, herein i represents a natural number indicating the number of the memory cell row that is selected. Row select signal /RDAi is set low and thus activated when memory block MBa is selected and an ith row is also selected. Otherwise, row select signal /RDAi is inactivated. Similarly, write drive circuit WDCb receives a row select signal /RDBi set low and thus activated selectively in response to which row is selected when memory block MBb is selected.

As a configuration corresponding to an odd-numbered write word line WWLj−1 is described representatively, write drive circuit WDCa arranged in memory block MBa for a (j−1)th row includes p channel MOS transistors 210 and 212 connected in parallel between a node Na(j−1) corresponding to one end (located in memory block MBa) of write word line WWLj−1 and power supply line 201. Transistor 210 turns on in response to row select signal /RDAj−1 being activated (set low). Transistor 212 turns on when either a row set signal /RDAj or /RDAj−2 corresponding to an adjacent row is set low and thus activated.

Write drive circuit WDCb arranged in memory block MBb for a (j−1)th row includes p channel MOS transistors 214 and 216 connected in parallel between a node Nb(j−1) corresponding to the other end (located in memory block MBb) of write word line WWLj−1 and power supply line 203. Transistor 214 turns on in response to row select signal /RDBj−1 being activated (set low). Transistor 216 turns on when either /RDBj or /RDBj−2 corresponding to an adjacent row is set low and thus activated.

An even-numbered write word line WWL has an intermediate point provided with a write drive circuit WDCm and opposite ends connected to ground voltage Vss via a select switch.

Write drive circuit WDCm receives a row decode signal (such as /RDj) similar to that shown in FIG. 2 that does not reflect information of a selection of a memory block. Each row decode signal is activated or set low selectively in response to which row is selected regardless of information of memory block selection.

As a configuration corresponding to an even-numbered write word line WWLj is described representatively, a jth row is associated with write drive circuit WDCm having p channel MOS transistors 218 and 220 connected in parallel between a node Nm(j) corresponding to an intermediate point thereof and power supply line 202. Transistor 218 turns on in response to row decode signal /RDj being activated (set low) and transistor 220 turns on when row decode signal RDj−1 or /RDj+1 corresponding to an adjacent row is set row and thus activated.

Write word line WWLj has one end corresponding to a node Na(j) connected to ground voltage Vss via an n channel MOS transistor 232 provided as a switch for selection. Transistor 232 turns on when memory block MBa is selected and either one of the corresponding jth row and the adjacent (j−1)th and (j+1)th rows is also selected. Similarly, write word line WWLj has the other end corresponding to a node Nb(j) connected to ground voltage Vss via an n channel MOS transistor 234 provided as a switch for selection. Transistor 234 turns on when memory block MBb is selected and either one of the corresponding jth row and the adjacent (j−1)th and (j+1)th rows is also selected.

Transistor 210, 214, 218 has a current driving ability or size designed to accommodate data writing current Iww of a selected row and transistors 212, 216, 220 has a current driving ability (or size) designed to accommodate magnetic field canceling current ΔIww of an adjacent row.

The other write word lines WWLs also have a configuration similar to that of either write word line WWLj−1 (an odd-numbered row) or WWLj (an even-numbered row).

As one example, if a selected memory cell belongs to memory block MBa on a jth row, row decode signal /RDj and row select signal /RDAj are set low and thus activated and the other row decode signals and row select signals are set high and thus inactivated. Thus, in the selected jth row, transistors 218 and 232 turn on and the other transistors 220 and 234 turn off. As a result, the selected row's write word line WWLj that corresponds to a region for memory block MBa alone has flowing therethrough data writing current Iww corresponding to the current driving ability of transistor 218.

In the adjacent, (j−1)th row, transistor 212 turns on and transistors 210, 214, 216 turn off. Consequently, the adjacent row's write word line WWLj−1 that corresponds to memory block MBa alone has magnetic field canceling current ΔIww flowing therethrough in a direction opposite to that of data writing current Iww flowing on a selected row (write word line WWLj). Similarly in the other adjacent, (j+1)th row transistor 242 turns on and transistors 240, 244, 246 turn off. Consequently, write word line WWLj+1 that corresponds to memory block MBa alone has current ΔIww flowing therethrough to cancel a leaking magnetic field introduced by current Iww flowing on write word line WWLj.

Furthermore, as another example, if a selected memory cell belongs to memory block MBb on a (j−1)th row, then row decode signal /RDj−1 and row select signal /RDBj−1 are set low and thus activated and the other row decode signals and row select signals are set high and thus inactivated. Thus in the selected, (j−1)th row transistor 214 alone turns on and the other transistors 210, 212, 216 turn off. Thus the selected row's write word line WWLj−1 that corresponds to memory block MBb alone has flowing therethrough data writing current Iww corresponding to the current driving ability of transistor 214.

In an adjacent row or a jth row transistors 220 and 234 turn on and transistors 218 and 232 turn off. The adjacent row's write word line WWLj that corresponds to memory block MBb alone has current ΔIww flowing therethrough in a direction opposite to that of current Iww flowing on a selected row (write word line WWLj−1). Similarly a (j−2)th row's write word line WWLj−2 that corresponds to memory block MBb alone has current ΔIww flowing therethrough.

For a (j+1)th row, which is neither a selected row nor an adjacent row, transistors 240, 242, 244, 246 are each turned off and write word line WWLj−1 is coupled to ground voltage Vss and no electric current thus flows.

The first embodiment in the third variation thus also provides a write drive circuit arranged to correspond to an intermediate point of write word line WWL to pass data writing current Iww or magnetic field canceling current ΔIww on write word lines of selected and adjacent rows only at a portion (memory block) corresponding to a selected memory cell. This can further reliably prevent erroneously writing data to non-selected memory cells of the selected row that form a group of memory cells belonging to that memory block which does not include the selected memory cell. Furthermore, current Iww can be passed on write word line WWL on a reduced path or against reduced resistance and data can thus be written faster and power consumption can be reduced.

While a selected row's write word line WWL has a portion passing a data writing current affecting an adjacent row through magnetic field noise, passing current ΔIww in the opposite direction can prevent data from being erroneously written, as has been described in the first and second variations of the first embodiment.

Figure 7:
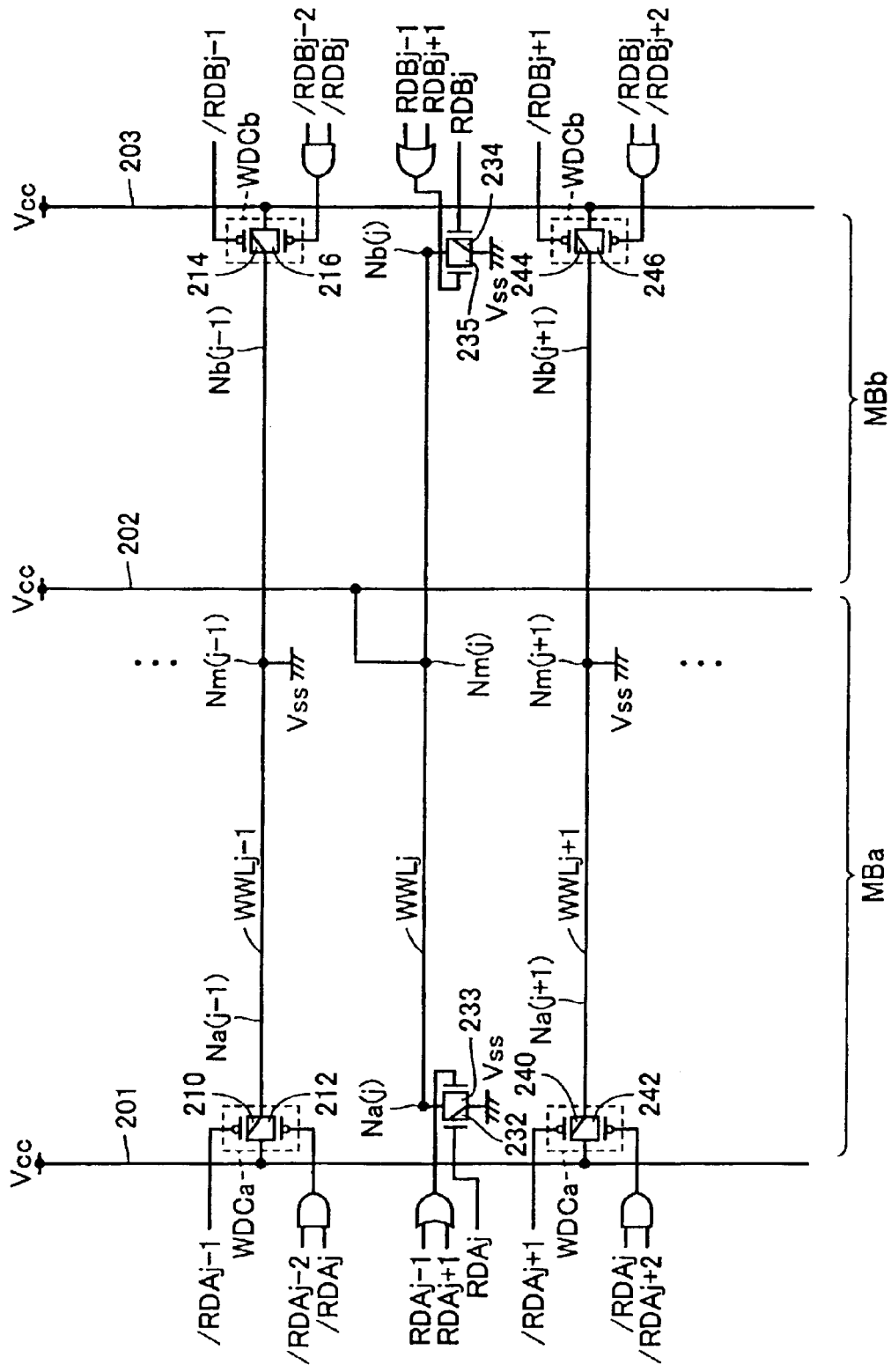
FIG. 7 is a circuit diagram illustrating a second example of supplying a data writing current to a write word line in accordance with the third variation of the first embodiment.

Alternatively, with reference to FIG. 7, even-numbered write word line WWLj may dispense with write drive circuit WDCm and have an intermediate point corresponding to node Nm(j) connected directly to power supply line 202. In this case, transistors 233 and 235 are further connected to transistors 232 and 234, respectively, in parallel. Transistors 232 and 234 have a current driving ability (or size) designed to accommodate current Iww of a selected row and transistors 233 and 235 have a current driving ability (or size) designed to accommodate current ΔIww of an adjacent row. Furthermore, transistors 232 and 234 can be turned on and off, as controlled in response to row select signals RDAj and RDBj, respectively, of the row of the interest, transistor 233 can be turned on and off, as controlled in response to an OR of row select signals RDAj−1 and RDAj+1 of an adjacent row, and transistor 235 can be turned on and off, as controlled in response to an OR of row select signals RDBj−1 and RDBj+1 of an adjacent row to allow currents Iww and ΔIww to be supplied, as described in the FIG. 6 configuration.

Figure 8:
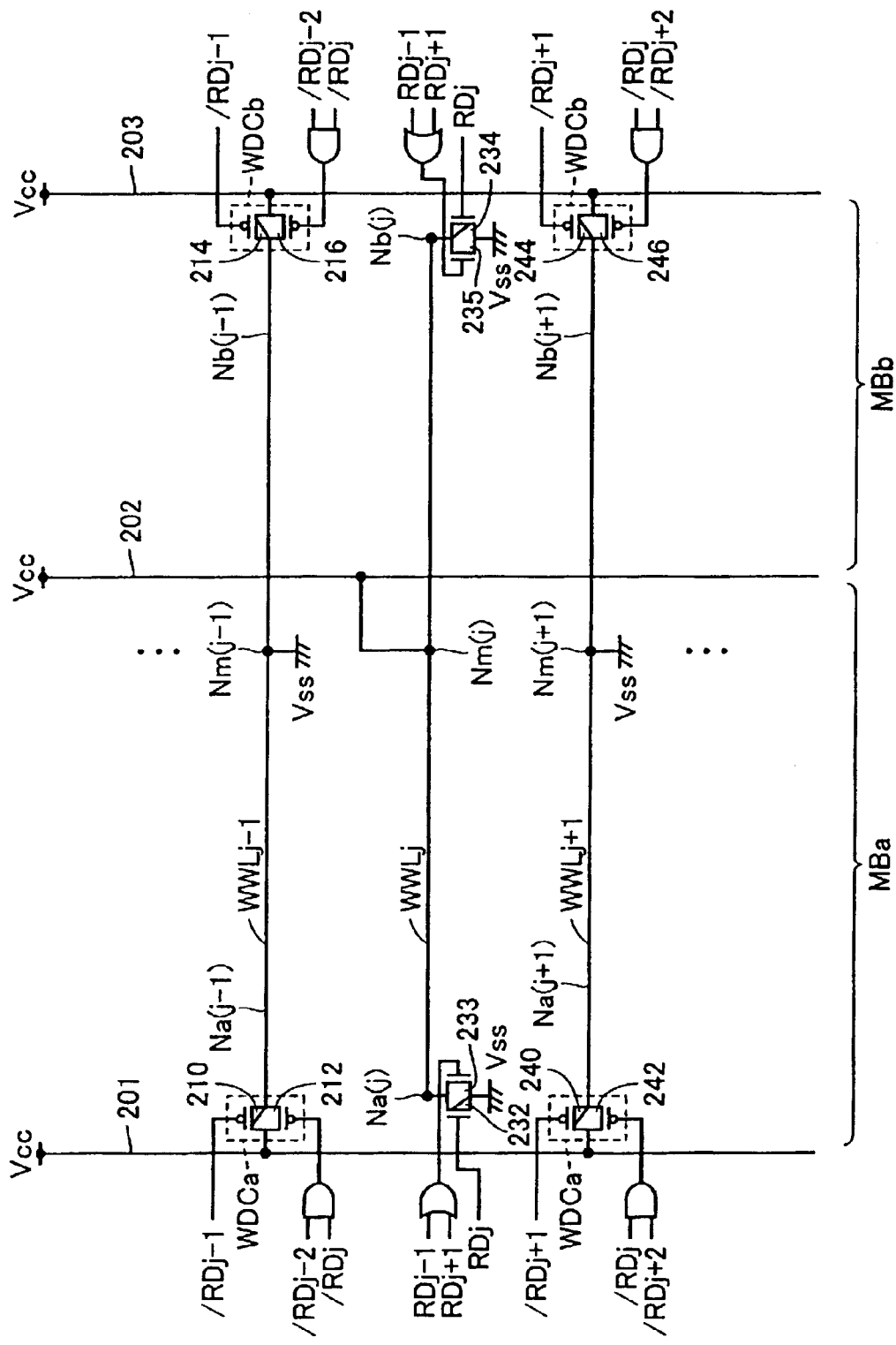
FIG. 8 is a circuit diagram illustrating a third example of supplying a data writing current to a write word line in accordance with the third variation of the first embodiment.

Furthermore, with reference to FIG. 8, in the FIG. 7 configuration an even-numbered write word line (for example WWLj) may have one end with transistors 232 and 233 turned on and off as controlled in response to row decode signal RDj commonly and the other end with transistors 235 and 237 turned on and off as controlled in response to row decode signals RDj−1 and RDj+1 commonly. In this case, whichever one of memory blocks MBa and MBb may be selected, each word line WWL has its entire length passing currents Iww and ΔIww. However, word drive circuits WDCa and WDCb can be configured of a group of transistors divided in arrangement and each circuit WDCa, WDCb can thus be smaller in size than in the FIG. 5 configuration arranging write drive circuit WWD for each write word line WWL only at one end.

Figure 9:
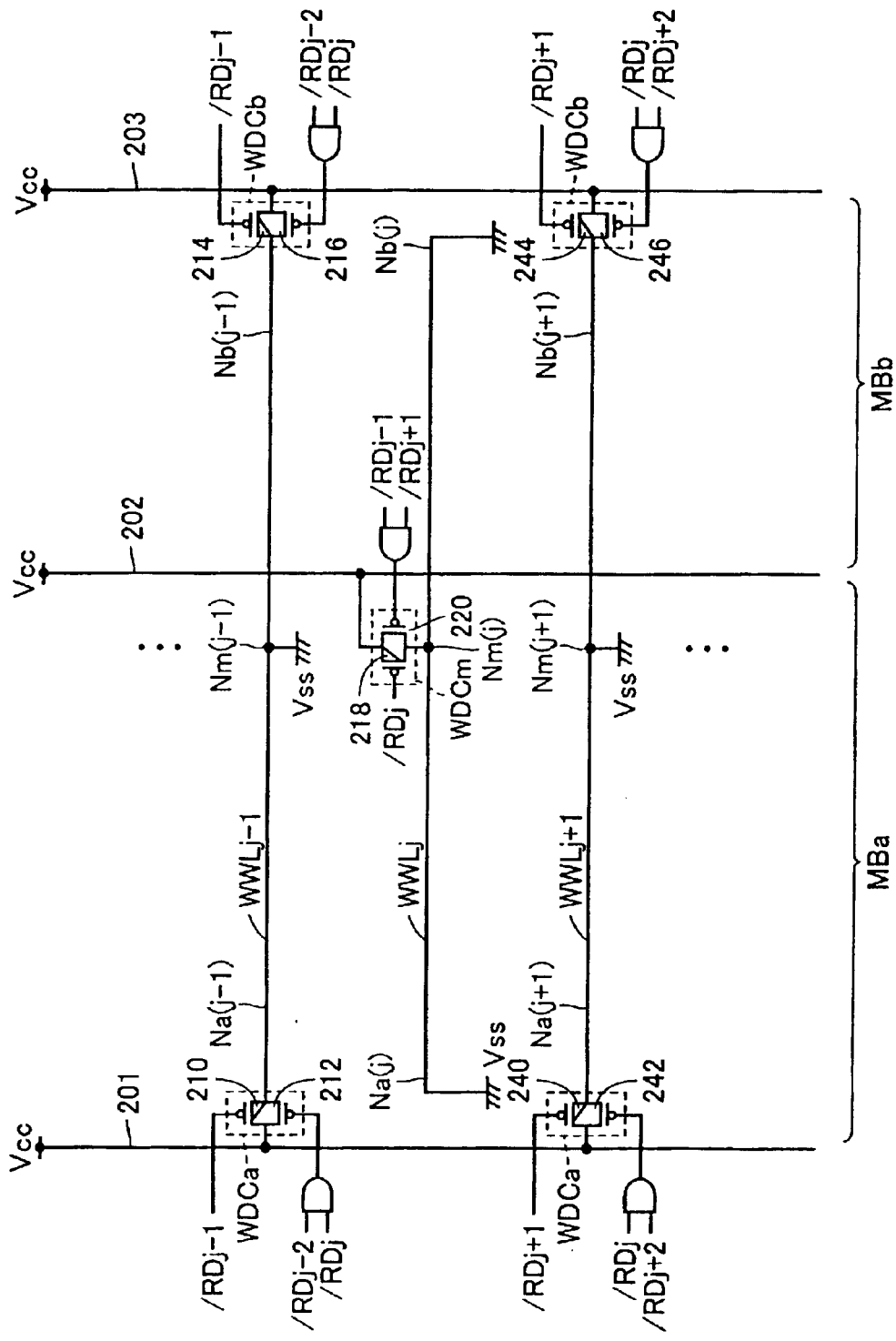
FIG. 9 is a circuit diagram illustrating a fourth example of supplying a data writing current to a write word line in accordance with the third variation of the first embodiment.

Similarly, with reference to FIG. 9, in the FIG. 6 configuration an odd-numbered write word line (for example WWLj) can have opposite ends provided with write drive circuits WDCa and WDCb, respectively, each controlled in accordance with common row decode signals.

Although not shown in FIGS. 6–9, for each of write drive circuits WDCa, WDCb, and WDCm a transistor corresponding to transistor 103 of the FIG. 2 write drive circuit WWDj may be provided between a corresponding node and ground voltage Vss. In this case, a write word line corresponding to neither a selected row nor an adjacent row can rapidly be discharged to have a non-selected state.

Furthermore, while the FIGS. 6–9 configurations power supply lines 201–203 pass power supply voltage Vcc, the two types of current supply circuits 110, 111 and current supply lines 112, 113 shown in FIG. 3 may replace each of power supply lines 201–203.

Second Embodiment

In a second embodiment is described a preferable timing of controlling a group of transistors configuring a write drive circuit.

Figure 10:
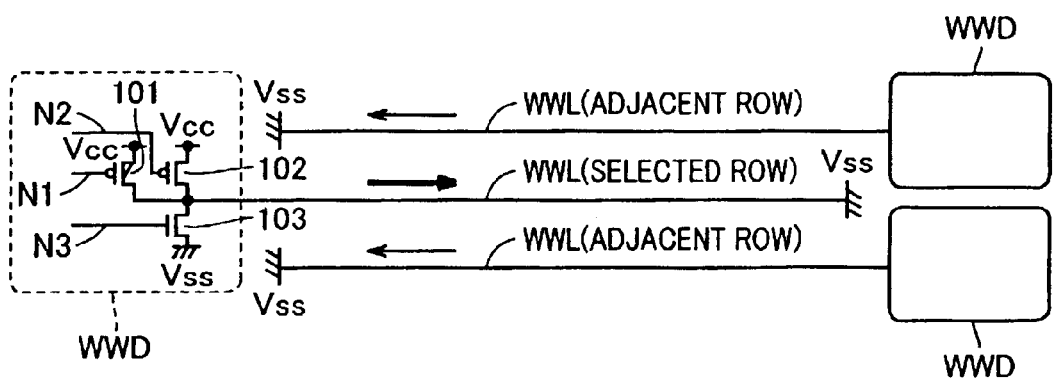
FIG. 10 shows a concept illustrating supplying a data writing current and a magnetic noise canceling current in accordance with the present invention in a second embodiment.

FIG. 10 shows a concept for illustrating supplying a data writing current and a magnetic field canceling current in accordance with the second embodiment.

With reference to FIG. 10, as well as the first embodiment and the variations thereof, the second embodiment also provides a configuration with write drive circuit WWD having transistors 101, 102 and 103 turning on and off in response to levels in voltage of nodes N1, N2 and N3, respectively. As such, when a corresponding memory cell row is selected, transistor 101 allows a data writing current Iww to be supplied, and if a corresponding memory cell row is an adjacent row then magnetic field canceling current ΔIww is supplied by transistor 102. Furthermore, in a non-selected row other than the adjacent row, transistor 103 is turned on to discharge a corresponding write word line WWL to ground voltage Vss.

However, if write word line WWL once selected is discharged by transistor 103 turning on and transistor 103 also has a current driving ability corresponding to current Iww then when transistor 103 turns on a corresponding write word line WWL would have a current equivalent to current Iww flowing therethrough in the opposite direction. If such a phenomenon is caused, the corresponding write word line WWL would recover to a non-selecting state at a delayed timing, resulting in an erroneous operation.

Accordingly, in the second embodiment transistor 103 has a current driving ability designed to be smaller than current Iww. This can be achieved simply by providing transistor 103 with a current driving ability (or size) designed to be smaller than current Iww (e.g., the current driving ability of transistor 101).

Figure 11:
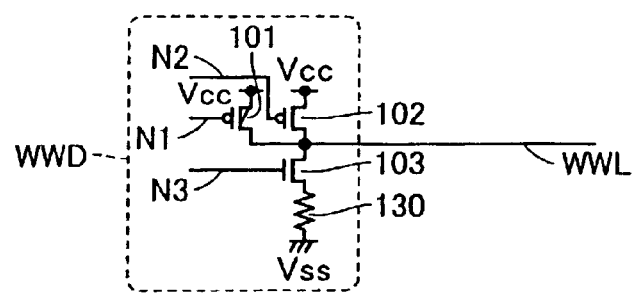
FIG. 11 is a circuit diagram showing an example of a configuration of a write drive circuit in the second embodiment.

Alternatively, with reference to FIG. 11, a current limit element 130 in the form of a resistor may be inserted on an electric current path formed between write word line WWL and ground voltage Vss via transistor 103. As a result a current flowing on write word line WWL when transistor 103 turns on can be smaller than current Iww, and in switching a row selection, write word line WWL corresponding to a selected or adjacent row can rapidly be shift to a non-selected state.

Figure 12:
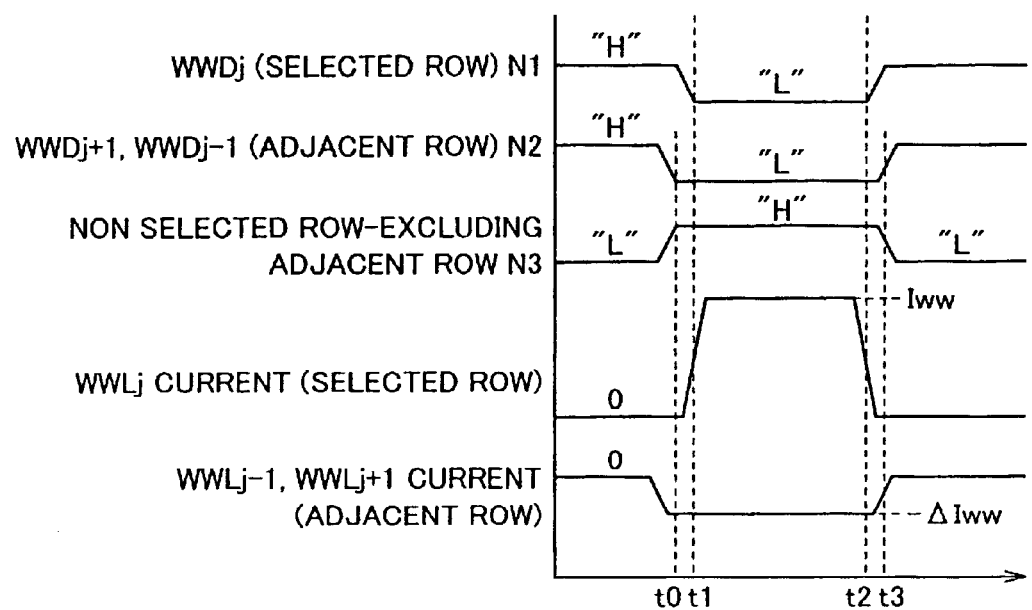
FIG. 12 represents a waveform of an operation for illustrating that data writing and magnetic noise canceling currents are supplied, as timed in accordance with the second embodiment.

FIG. 12 represents waveforms of an operation for illustrating a timing at which a data writing current and a magnetic field canceling current are supplied in accordance with the second embodiment.

FIG. 12 represents waveforms of an operation provided when a jth row is selected.

With reference to FIG. 12, when in starting a data write operation, node N1 of write drive circuit WWDj of a selected row is driven by a row select result to transition from high to low at time t1. Earlier than time t1 at time t0, write drive circuits WWDj+1, WWDj−1 corresponding to adjacent rows have node N2 set low and a write drive circuit corresponding to a non-selected row other than the adjacent rows has node N3 set high. Thus, the adjacent rows' write word lines WWLj−1 and WWLj+1 are supplied with current ΔIww, as started at a timing faster than the selected row's write word line WWLj is supplied with current Iww.

Furthermore, in terminating the data write operation, write drive circuit WWDj (the selected row) has node N1 transitioning from low to high at time t2. Later than time t2 at time t3 write drive circuits WWDj+1, WWDj−1(adjacent rows) have node N2 starting to transition to the high level and a write drive circuit corresponding to a non-selected row other than the adjacent rows has node N2 also starting to transition to the high level. Row select circuits 20, 21 transmits a result of decoding at a timing set so that in write drive circuit WWD nodes N1–N3 has a level varying at the timing as described above.

As a result, an adjacent row is supplied with current ΔIww for a period (corresponding to time t0 through t3) set to include a period in which a selected row is supplied with current Iww (i.e., time t1 through t2). This ensures that a magnetic field canceling current cancels a leaking magnetic field to further ensure that erroneous data writing is prevented.

Third Embodiment

A third embodiment describes setting a ratio of data writing current Iww and magnetic field canceling current ΔIww.

Figure 13:
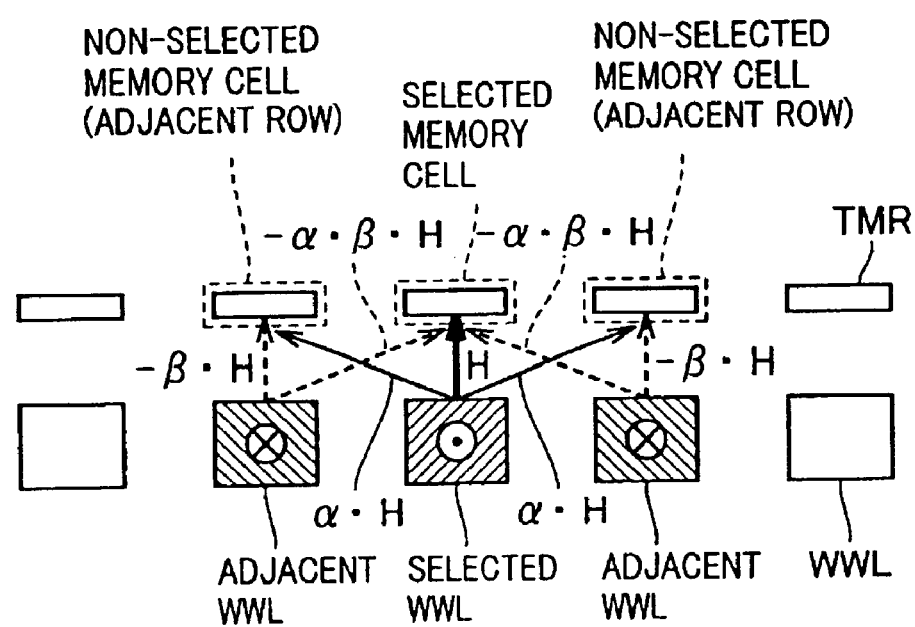
FIG. 13 represents a concept for illustrating that data writing and magnetic noise canceling currents are set in a ratio in accordance with a third embodiment.

FIG. 13 shows a concept for illustrating how a ratio of a data writing current and a magnetic field canceling current is set in accordance with the third embodiment.

With reference to FIG. 13, a selected row's write word line (hereinafter also referred to as a "selected WWL") has data writing current Iww flowing therethrough and an adjacent write word line (hereinafter also referred to as an "adjacent WWL") has magnetic field canceling current ΔIww flowing therethrough. Herein β represents a ratio of current ΔIww to Iww, i.e., |ΔIww|/|Iww|, wherein β is a real number larger than zero and smaller than one. Furthermore, α represents a degree of leakage of a magnetic field generated between each write word line WWL, wherein α is a real number larger than zero and smaller than one. More specifically, 1:α represents a ratio between an intensity of a magnetic field introduced by a current of write word line WWL and acting on an MTJ memory cell of a corresponding memory cell row and an intensity of a magnetic field introduced by the identical current and acting on an MTJ memory cell of an adjacent row.

As such, if a selected WWL has current Iww flowing therethrough acting on the selected row's MTJ memory cell (tunneling magneto-resistance element TMR) through a magnetic field having intensity H, then current Iww acts on an adjacent row's non-selected memory cell through a magnetic field having intensity represented by "α·H". Furthermore, an adjacent WWL has current −ΔIww (the sign indicates a direction opposite to that of current Iww) flowing therethrough acting on the adjacent row's MTJ memory cell (element TMR) through a magnetic field having intensity "−β·H." Furthermore, an adjacent row's current −ΔIww acts on a selected row's MTJ memory cell through a magnetic field indicated by "−α·−β·H," multiplied by α.

These magnetic fields, added together, act on the selected row's MTJ memory cell through a magnetic field:

$$Hsl = H - 2\cdot\alpha\cdot\beta\cdot H = (1 - 2\cdot\alpha\cdot\beta)\cdot H \qquad (1).$$

Furthermore the adjacent row's MTJ memory cell is acted on by a magnetic field:

$$Hns = \alpha\cdot H - \beta\cdot H = (\alpha - \beta)\cdot H \qquad (2).$$

Thus from equations (1) and (2), writing data to the selected row's MTJ memory cell at least entails Hs1 larger than zero. From this condition, for α and β the following equation:

$$1 - 2\cdot\alpha\cdot\beta > 0$$

$$\beta < 1/(2\cdot\alpha) \qquad (3)$$

is derived.

Furthermore, to prevent the adjacent row's MTJ memory cell from having data erroneously written thereto, Hsl greater than Hns is at least required and the following equation:

$$1 - 2\cdot\alpha\cdot\beta > |\alpha - \beta| \qquad (4)$$

is thus also derived.

Figure 16:
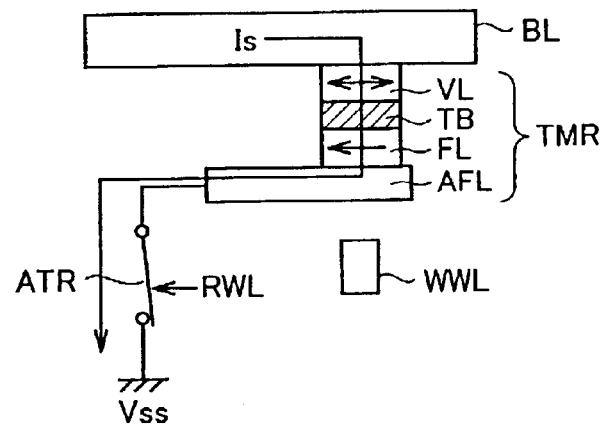
FIG. 16 represents a concept for illustrating an operation reading data from a MTJ memory cell.
Figure 17:
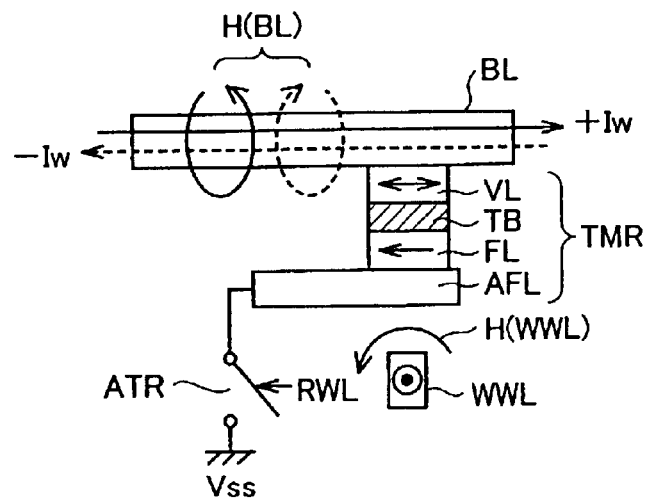
FIG. 17 represents a concept for illustrating an operation writing data to a MTJ memory cell.

Thus the ratio of currents ΔIww to Iww can be determined quantitatively in accordance with equations (3) and (4) with degree α of magnetic field leakage between adjacent write word lines WWLs taken into consideration. Thus in the first embodiment and the variations thereof and the second embodiment current ΔIww can appropriately be set in amount. In doing so, considering the FIG. 16 asteroid characteristics line further ensures that erroneous data writing is prevented.

Fourth Embodiment

A fourth embodiment provides a configuration supplying a magnetic field canceling current to cancel a leaking magnetic field attributed to a data writing current supplied to a bit line of a selected column.

Figure 14:
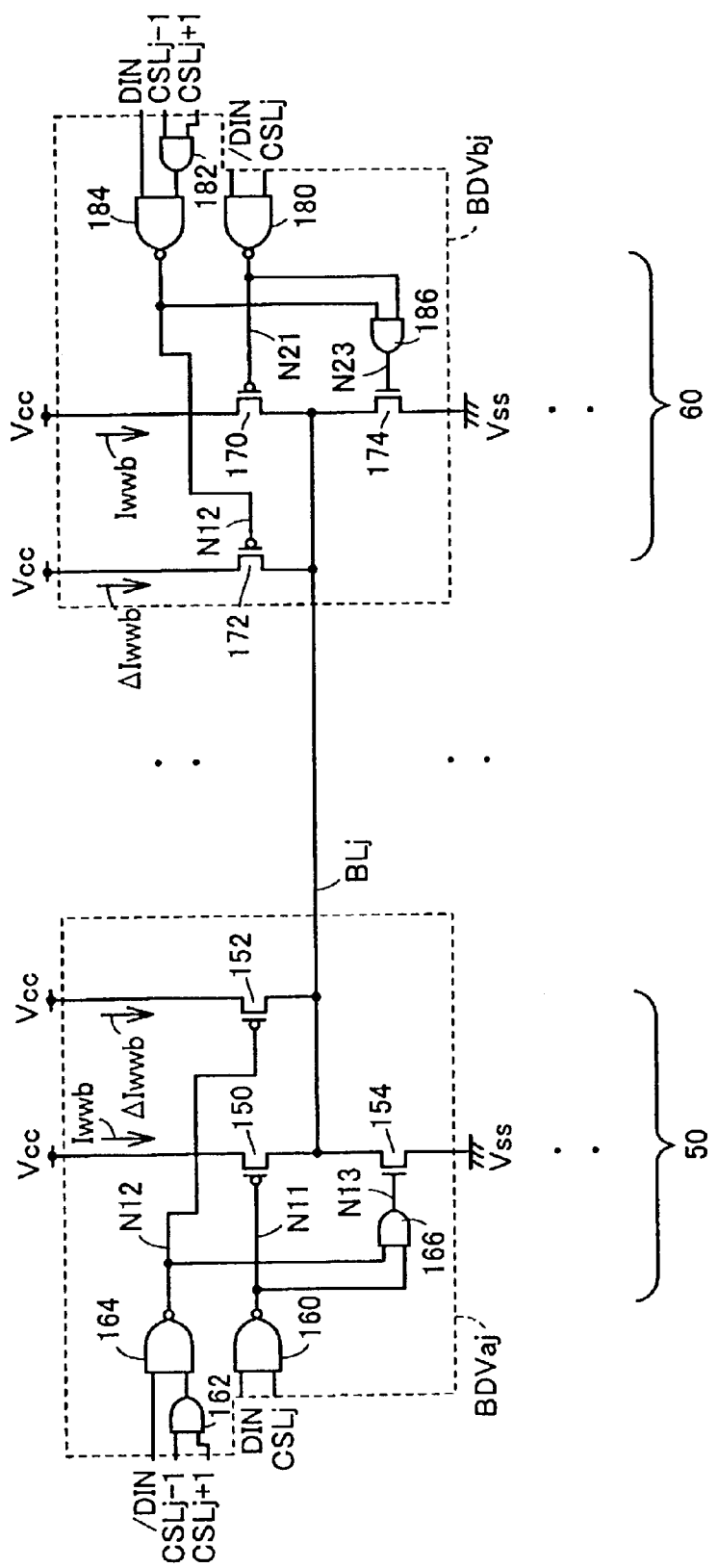
FIG. 14 is a circuit diagram showing a configuration of a bit line drive circuit in accordance with a fourth embodiment.
Figure 15:
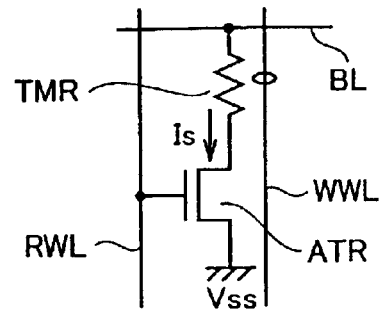
FIG. 15 is a diagram schematically showing a configuration of an MTJ memory cell.

FIG. 14 is a circuit diagram showing a configuration of a bit line drive circuit in accordance with the fourth embodiment.

The FIG. 14 bit line drive circuits BDVa and BDVb are as shown in FIG. 2, arranged to correspond to one and the other ends, respectively, of each of bit lines BL1–BLm. FIG. 14 representatively shows a configuration of bit line drive circuits BDVaj and BDVbj provided for a bit line BLj.

Bit line drive circuit BDVaj includes p channel MOS transistors 150 and 152 connected in parallel between power supply voltage Vcc and one end of bit line BLj, and an n channel MOS transistor 154 connected between bit line BLj and ground voltage Vss. Transistors 150, 152 and 154 have their respective gates connected to nodes N11, N12 and N13, respectively.

Transistor 150 has a current driving ability (or size) corresponding to a data writing current Iwwb flowing on bit line BL of a selected column. Similarly transistor 152 has a current driving ability (or size) corresponding to a magnetic field canceling current ΔIwwb for canceling a magnetic field leaking when an adjacent bit line has current Iwwb flowing therethrough.

Bit line drive circuit BDVaj also includes a logic gate 160 outputting to node N11 an NAND of write data DIN and a column select line CSLj driven high and thus activated when a corresponding bit line BLj is selected, a logic gate 162 outputting an OR of column select lines CSLj−1 and CSLj+1 reflecting a result of a selection of a column of an adjacent row, a logic gate 164 outputting to node N12 an NAND of an output of logic gate 162 and data /DIN, an inverted version of write data DIN, and a logic gate 166 outputting an AND of nodes N11 and N12 to node N13.

Thus transistor 150 turns on when a corresponding memory cell column is selected and write data DIN also has a high level. Transistor 152 turns on when either an adjacent, (j−1)th or (j+1)th row is selected and write data DIN also has a low level. Transistor 154 turns on when transistors 150 and 152 are both turned off.

Bit line drive circuit BDVbj includes p channel MOS transistors 170 and 172 connected in parallel between power supply voltage Vcc and the other end of bit line BLj, and an n channel MOS transistor 174 connected between bit line BLj and ground voltage Vss. Transistors 170, 172 and 174 have their respective gates connected to nodes N21, N22 and N23, respectively.

Transistor 170 has a current driving ability (or size) corresponding to a data writing current Iwwb. Similarly transistor 172 has a current driving ability (or size) corresponding to a magnetic field canceling current ΔIwwb.

Bit line drive circuit BDVbj also includes a logic gate 180 outputting to node N21 an NAND of /DIN, an inverted version of write data DIN, and a column select line CSLj, a logic gate 182 outputting an OR of column select lines CSLj−1 and CSLj+1 reflecting a result of a selection of a column of an adjacent row, a logic gate 184 outputting to node N22 an NAND of an output of logic gate 182 and write data DIN, and a logic gate 186 outputting an AND of nodes N21 and N22 to node N23.

Thus transistor 170 turns on when a corresponding memory cell column is selected and write data DIN also has a low level. Transistor 172 turns on when either an adjacent, (j−1)th or (j+1)th row is selected and write data DIN also has a high level. Transistor 174 turns on when transistors 170 and 172 are both turned off.

For example, if the high level is written to a selected memory cell of a jth column, transistors 150 and 174 turn on to pass current Iwwb in a direction from bit line drive circuits BDVaj to BDVbj. In contrast, if write data DIN has the low level, transistors 170 and 154 turn on to pass current Iwwb in a direction opposite to that which is followed when data having the low level is written.

If an adjacent, (j−1)th or (j+1)th column is selected, then, for write data having the high level, transistors 172 and 154 turn on, and for write data having the low level, transistors 152 and 174 turn on to allow current ΔIwwb to be passed in a direction opposite to that of a data writing current flowing on a bit line of an adjacent column.

This can also prevent erroneous data writing attributed to a leaking magnetic field produced from a bit line corresponding to a selected column.

Note that the variations of the first embodiment noting a data writing current of the direction of a row, and the variations in configuration described in the second and third embodiments can each be combined with the configuration of the fourth embodiment noting a data writing current of the direction of a column.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device comprising:

a memory array having a matrix of a plurality of magnetic memory cells each having a magnetic element magnetized in a direction corresponding to data stored;

a plurality of write select lines provided for memory cell rows, respectively;

a plurality of data lines provided for memory cell columns, respectively;

a write control circuit driven by a result of a column selection to selectively pass a current on a data line corresponding to a selected magnetic memory cell, said current having a direction corresponding to write data; and a row select circuit driven by a result of a row selection for controlling selectively supplying a current to said plurality of write select lines, said row select circuit supplying a data writing current to the write select line corresponding to a selected row and a magnetic field canceling current to the write select line corresponding to a row adjacent to said selected row, said magnetic field canceling current being smaller than said data writing current, said magnetic field canceling current being directed in a direction opposite to that of said data writing current flowing on said write select line corresponding to said selected row, in each said write select line said data writing current when said corresponding memory cell row is selected and said magnetic field canceling current when said adjacent row is selected being supplied in a single direction.

2. The memory device according to claim 1, wherein said row select circuit includes a driver circuit provided for each said write select line to supply said data writing current and said magnetic field canceling current, said driver circuit being driven by said result of said row selection to control a voltage of an end of a corresponding one of said plurality of write select lines.

3. The memory device according to claim 2, wherein said driver circuit is staggered in arrangement to correspond to one end of every other one of said plurality of write select lines and the other end of each of said plurality of write select lines other than said every other write select line.

4. The memory device according to claim 1, wherein;

said row select circuit includes a driver circuit provided for one of opposite ends of each said write select line to supply said data writing current and said magnetic field canceling current;

said driver circuit is driven by said result of said row selection to connect to a first voltage one end of a corresponding one of said plurality of write select lines;

each said write select line has the other end connected to a second voltage regardless of said result of said row selection; and said driver circuit is staggered in arrangement for each row.

5. The memory device according to claim 1, wherein:

said row select circuit includes a driver circuit provided for each said write select line to supply said data writing current and said magnetic field canceling current, said driver circuit being driven by said result of said row selection to control a voltage of one of opposite ends and an intermediate point of a corresponding one of said plurality of write select lines.

6. The memory device according to claim 5, wherein said driver circuit are staggered in arrangement to correspond to said opposite ends of every other one of said write select lines and said intermediate point of said write select lines other than said every other write select line.

7. The memory device according to claim 6, wherein:

said driver circuit is driven by said result of said row selection to connect to a first voltage said one of said intermediate point and said opposite ends of said corresponding one write select line; and at least in said selected row and said adjacent row the other one of said intermediate point and said opposite ends of said corresponding write select line is connected to a second voltage.

8. The memory device according to claim 1, wherein:

said row select circuit includes a driver circuit for each said write select line to supply said data writing current and said magnetic field canceling current;

said driver circuit has a plurality of driver units each having a different current driving ability; and said driver circuit uses different ones of said driver units to supply said data writing current and said magnetic field canceling current, respectively.

9. The memory device according to claim 1, said memory array being divided in a direction of said column into a plurality of memory blocks, in each said memory cell row each said write select line being divided to correspond to each said memory block, the memory device further comprising a main write select line arranged for every K memory cell rows and selectively activated when said K memory cell rows corresponding thereto include said selected row, K representing an integer of no less than two, said row select circuit operating in response to levels of a select signal and said main write select line to selectively supply said data writing current and said magnetic field canceling current to write select lines corresponding to said selected row and said adjacent row, respectively, in a selected one of said plurality of memory blocks, said select signal being for selecting one of every said K memory cell row set for each said memory block independently.

10. The memory device according to claim 1, wherein:

said row select circuit includes a driver circuit provided for each said write select line; and said driver circuit includes a first drive unit provided between a first voltage and a corresponding one of said write select lines and supplying said corresponding one write select line with said data writing current when a corresponding memory cell row is selected, a second drive unit provided between said first voltage and said corresponding one write select line to supply said corresponding one write select line with said magnetic field canceling current when a memory cell row adjacent to said corresponding memory cell row is selected, and a third drive unit electrically coupling said corresponding one write select line with a second voltage when neither said corresponding memory cell row nor said adjacent memory cell row are selected, when said third drive unit is turned on a current flowing on said corresponding one write select line smaller than said data writing current.

11. The memory device according to claim 10, wherein said third drive unit has a smaller ability to drive a current than said first drive unit.

12. The memory device according to claim 1, wherein in a single data write operation, said row select circuit controls the supply of said data writing current and said magnetic field canceling current to allow a first period to be included in a second period, said first period allowing said data writing current to flow on said write select line corresponding to said selected row, said second period allowing said magnetic field canceling current flowing on said write select line corresponding to said adjacent row.

13. The memory device according to claim 1, wherein a sum of magnetic fields applied by said data writing current and said magnetic field canceling current, respectively, to said magnetic memory cell of said selected row, is larger in intensity than a sum of magnetic fields applied by said data writing current and said magnetic field canceling current, respectively, to said magnetic memory cell of the row adjacent to said adjacent row.

14. The memory device according to claim 13, wherein when $\alpha$ represents a ratio in intensity of magnetic fields introduced by a current flowing through one of said plurality of write select lines, and acting on a magnetic memory cell of a corresponding memory cell row and a magnetic memory cell of a row adjacent to said corresponding memory cell row, respectively, a ratio $\beta$ of said magnetic field canceling current to said data writing current is set to satisfy $$(1-2\cdot\alpha\cdot\beta)>|\alpha-\beta|,$$

$\alpha$ and $\beta$ each being a real number larger than zero and smaller than one.

15. A thin film magnetic memory device comprising:

a memory array having a matrix of a plurality of magnetic memory cells each having a magnetic element magnetized in a direction corresponding to data stored;

a plurality of write select lines provided for memory cell rows, respectively;

a plurality of data lines provided for memory cell columns, respectively;

a row select circuit driven by a row select result for controlling selectively supplying a current to said plurality of write select lines;

a write control circuit driven by a column select result and write data to be written to a selected magnetic memory cell, for controlling selectively supplying a current to said plurality of data lines, said write control circuit supplying said data line corresponding to a selected column with a data writing current having a direction corresponding to said write data, said write control circuit also supplying said data line corresponding to a column adjacent to said selected column with a magnetic field canceling current in a direction opposite to that of said data writing current flowing through said data line corresponding to said selected column, said magnetic field canceling current being smaller than said data writing current.

16. The memory device according to claim 15, wherein:

said write control circuit includes a plurality of driver circuits provided for opposite ends, respectively, of each said data line, each said driver circuit including a first drive unit provided between a first voltage and a corresponding one of said plurality of data lines and operative in response to said write data to connect said first voltage and said corresponding one data line together to supply said data writing current when a corresponding memory cell column is selected, a second drive unit provided between said first voltage and said corresponding one data line and operative in response to said write data to connect said first voltage and said corresponding data line together to supply said magnetic field canceling current when a selected column is adjacent to said corresponding memory cell column, and a third drive unit operative to electrically coupling said corresponding one data line and a second voltage together when said first and second drive units both decouple said corresponding data line and said first voltage.

17. A thin film magnetic memory device comprising:

a memory array having a matrix of a plurality of magnetic memory cells each having a magnetic element magnetized in a direction corresponding to data stored;

a plurality of write select lines provided for memory cell rows, respectively;

plurality of data lines provided for memory cell columns, respectively;

a write control circuit driven by a result of a column selection to selectively pass a current on a data line corresponding to a selected magnetic memory cell, said current having a direction corresponding to write data; and a row select circuit driven by a result of a row selection for controlling selectively supplying a current to said plurality of write select lines, said row select lines, said row select curcuit supplying a data writing current to the write select line corresponding to a select row, said row select circuit including a driver circuit provided for each said write select line to supply said data writing current, said driver circuit being driven by said result of said row selection to control a voltage of an end of a cirresponding one of said plurality of write select lines.

18. A thin film magnetic memory device comprising:

a memory array having a matrix of a plurality of magnetic memory cells each having a magnetic element magnetized in a direction corresponding to data stored;

a plurality of write select lines provided for memory cell rows, respectively;

a plurality of data lines provided for memory cell columns, respectively;

a write control circuit driven by a result of a column selection to selectively pass a current on a data line curresponding to a selected magnetic memory cell, said current having a direction curresponding to write data; and a row select curcuit driven by result of a row selection for controlling selectively supplying a current to said plurality of write select lines, said row select circuit supplying a data writing current to the write select line corresponding to a selected row, said riw select circuit including a driver circuit provided for each and write select line to supply said data writing current, said driver circuit being driven by said result of said row selection to control a voltage of an end of a curresponding one of said plurality of write select lines, wherein;

said driver circuit is staggered in arangement to correspond to one end of every other one of said plurality of write select lines and the other end of each of said plurality of write select lines other than said every other write select line.

19. A thin film magnetic memory device comprising:

a memory array having a matrix of a plurality of magnetic memory cells each having a magnetic element magnetized in a direction corresponding to data stored;

a plurality of write select lines provided for memory cell rows, respectively;

a plurality of data lines provided for memory cell columns, respectively;

a write control circuit driven by a result of a column selection to selectively pass a current on a data line corresponding to a selected magnetic memory cell, said current having a direction corresponding to write data; and a row select circuit driven by a result of a row selection for controlling selectively supplying a current to said plurality of write select lines, said row select circuit supplying a data writing current to the write select line corresponding to a selected row, wherein said row select circuit includes a driver circuit provided for one of opposite ends of each said write select line to supply siad data writing current, said driver circuit is driven by said result of siad row selection to connect to a first voltage one eand of a corresponding one of said plurality of write select lines, each said write select line has the other end connected to a second voltage regardless of said result of said row selection, and said driver circuit is staggered in arrangement for each row.

20. A thin film magnetic memory device comprising:

a memory array having a matrix of a plurality of magnetic memory cells each having a magnetic element magnetized in a direction corresponding to data stored;

a plurality of write select lines provided for memory cell rows, respectively;

a plurality of data lines provided for memory cell columns, respectively;

a write control circuit driven by a result of a column selection to selectively pass a current on a data line corresponding to a selected magnetic memory cell, said current having a direction corresponding to write data; and a row select circuit driven by a result of a row selection for controlling selectively supplying a current to said plurality of write select lines, said row select circuit supplying a data writing current to the write select line corresponding to a selected row, wherein said row select circuit includes a driver circuit provided for each said write select line to supply siad data writing current, said driver circuit being driven by said result of said row selection to control a voltage of one of opposite ends and an intermediate point of a corresponding one of said plurality of write select lines.

21. A thin film magnetic memory device comprising:

a memory array having a matrix of a plurality of magnetic memory cells each having a magnetic element magnetized in a direction corresponding to data stored;

A plurality of write select lines provided for memory cell rows, respectively;

a plurality of data lines provided for memory cell columns, respectively;

a write control circuit driven by a result of a column selection to selectively pass a current on a data line corresponding to a selected magnetic memory cell, said current having a direction corresponding to write data; and a row select circuit driven by a result of a row selection for controlling selectively supplying a current to said plurality of write select lines, said row select circuit supplying a data writing current to the write select line corresponding to a selected row, said memory array being divided to a direction of said column into a plurality of memory blocks, in each said memory cell row each said write select line being divided to correspond to each said memory block, the memory device further comprising a main write select line arranged for every K memory cell rows and selectively activated when said K memory cell rows corresponding thereto include said selected row, K representing an integer of no less than two, said row select circuit operating in response to levels of a select signal and said main write select line to selectively supply said data writing current to write select lines corresponding to said selected fow in a selected one of said plurality of memory blocks, said select signal being for selecting one of every said K memory cell row set for each said memory block independently.

22. A thin film magnetic memory device comprising:

a memory array having a plurality of memory cells each having a magnetic element magnetized in a direction corresponding to data stored;

a plurality of data writing current lines provided for a plurality of sections of said memory cells, respectively; and a current control circuit for controlling selectively supplying a current to said data writing current lines in accordance with selection of said sections;

said current control curcuit supplying a data writing current to the data writing current line corresponding to a selected section and a magnetic field canceling current to the data writing current line corresponding to a section adjacent to said selected section, said magnetic field canceling current being smaller than said data writing current, said magnetic field canceling current being directed in a direction opposite to that of said data writing current flowing on said data writing current line corresponding to said selected section, wherein in a single data write operation, said current control circuit controls the supply of said data writing current and said magnetic field canceling current to allow a first period to be included in a second period, said first period allowing said data writing current to flow on said data writing current line corresponding to said selected section, said second period allowing said magnetic field canceling current flowing on said data writing current line corresponding to the section adjacent to said selected section.

23. A thin film magnetic memory device comprising:

a memory array having a plurality of memory cells each having a magnetic element magnetized in a direction corresponding to data stored;

a plurality of data writing current lines provided for a plurality of sections of said memory cells, respectively; and a current control circuit for controlling selectively supplying a current to said data writing current lines in accordance with selection of said sections;

said current control circuit supplying a data writing current to the data writing current line corresponding to a selected section and a magnetic field canceling current to the data writing current line corresponding to a section adjacent to said selected section, said magnetic field canceling current being smaller than said data writing current, said magnetic field canceling current being directed in a direction opposite to that of said data writing current flowing on said data writing current line corresponding to said selected section, wherein a sum of magnetic fields applied by said data writing current and said magnetic field canceling current, respectively, to said memory cell of said selected section, is larger in intensity than a sum of magnetic fields applied by said data writing current and said magnetic field canceling current, respectively, to said memory cell of the section adjacent to said selected section.

* * * * *